United States Patent [19]
Horiguchi et al.

[11] Patent Number: 5,616,956
[45] Date of Patent: Apr. 1, 1997

[54] CIRCUIT SUBSTRATE INCLUDING INSULATING LAYER OF ALUMINUM NITRIDE AND ELECTRICALLY CONDUCTIVE LAYER OF CONDUCTIVE COMPONENT, ALUMINUM NITRIDE AND OTHER COMPONENTS, AND SEMICONDUCTOR DEVICE CONTAINING SAME

[75] Inventors: Akihiro Horiguchi; Jun Monma; Kazuo Kimura; Katsuyoshi Oh-Ishi, all of Kanagawa-ken; Fumio Ueno, Tokyo; Mitsuo Kasori, Kanagawa-ken; Hiroyasu Sumino, Kanagawa-ken, all of Japan

[73] Assignee: Kabushiki Kaisha Toshiba, Kawasaki, Japan

[21] Appl. No.: 524,906

[22] Filed: Sep. 7, 1995

[30] Foreign Application Priority Data

Sep. 16, 1994 [JP] Japan ..................................... 6-221327

[51] Int. Cl.$^6$ ........................... H01L 23/02; H01L 23/48; H01L 29/62; C04B 35/58
[52] U.S. Cl. .......................... 257/703; 257/750; 257/704; 257/705; 257/741
[58] Field of Search .................................... 257/750, 705, 257/703, 704, 701, 758, 741

[56] References Cited

U.S. PATENT DOCUMENTS

| | | | |
|---|---|---|---|
| 4,517,584 | 5/1985 | Matsushita et al. | 257/705 |
| 4,561,010 | 12/1985 | Ogihara et al. | 257/705 |
| 4,651,192 | 3/1987 | Matsushita et al. | 257/705 |
| 4,746,637 | 5/1988 | Kasori et al. | 501/98 |
| 4,777,060 | 10/1988 | Mayr et al. | 437/235 |
| 4,796,077 | 1/1989 | Takeda et al. | 257/705 |
| 4,883,780 | 11/1989 | Kasori et al. | 501/96 |
| 5,001,089 | 3/1991 | Kasori et al. | 501/96 |
| 5,095,359 | 3/1992 | Tanaka et al. | 257/703 |
| 5,216,807 | 6/1993 | Yoshizawa et al. | 257/778 |

FOREIGN PATENT DOCUMENTS

| | | |
|---|---|---|
| 61-117160 | 6/1986 | Japan . |
| 62-153173 | 7/1987 | Japan . |
| 4-130064 | 5/1992 | Japan . |

*Primary Examiner*—Steven H. Loke
*Assistant Examiner*—Alexander Oscar Williams
*Attorney, Agent, or Firm*—Foley & Lardner

[57] ABSTRACT

Disclosed is a circuit substrate and a semiconductor device to which the circuit substrate is applied. The circuit substrate has an insulating layer and an electrically conductive layer. The insulating layer is composed of a sintered aluminum nitride composition containing: aluminum nitride; a first component given by a compound containing an element which is selected from the group consisting of group IIa elements and group IIIa elements of the periodic table; a second component given by either a simple boron or a boron compound; and a third component give by either a simple manganese or a manganese compound. The electrically conductive layer contains: a conductive component given by a metal or an electrically conductive compound for exhibiting electric conductivity; aluminum nitride; the first component; the second component; and the third component. The semiconductor device has the above circuit substrate, a semiconductor element mounted on the circuit substrate, and a cap being tightly bonded to the circuit substrate with a sealing glass to cover the semiconductor element.

32 Claims, 2 Drawing Sheets

CIRCUIT SUBSTRATE INCLUDING INSULATING LAYER OF ALUMINUM NITRIDE AND ELECTRICALLY CONDUCTIVE LAYER OF CONDUCTIVE COMPONENT, ALUMINUM NITRIDE AND OTHER COMPONENTS, AND SEMICONDUCTOR DEVICE CONTAINING SAME

BACKGROUND OF THE INVENTION

Field of the Invention

The present invention relates to a semiconductor device and a substrate on which a semiconductor element is mounted to form the semiconductor device, particularly to a semiconductor and a substrate suitable for mounting an electrical element which is highly integrated.

In recent years, the requirements for materials for semiconductor devices have reached a new stage of strictness, as high densification and high integration of electrical elements for semiconductor elements progress. In particular, it has been required to improve the material which is formed into the substrate of the semiconductor device, for advancing durability and reliability of the semiconductor devices on which an highly integrated electrical element is mounted.

Conventionally, substrates which are made of alumina ($Al_2O_3$) has been utilized to equip the electric elements, form electric circuits or make insulation. However, thermal conductivity of the alumina substrate is about 20 W/m·K, and it is too low to sufficiently radiate the heat generated on the electrical element toward the outside of the semiconductor device, particularly, when a highly integrated circuit such as LSIs, ICs and the like is applied to the semiconductor device.

In the above circumstances, a great deal of attention is now being paid to the realization of circuit substrates utilizing a base material formed from an aluminum nitride (AlN) sintered product with a high thermal conductivity which can cope with the densification and high integration of LSIs which has been taking place in recent years.

However, aluminum nitride exhibits strong covalent bonding and is a difficult material to sinter. Therefore, the minimum sintering temperature of 1800° C. is indispensable in obtainig a finely sintered body.

In order to improve this situation, Japanese Laid-Open Patent Application No. 61-117160 discloses a method whereby low temperature sintering is provided using a raw material in which a compound of rare earth elements and an oxide of alkaline earth elements are added to an aluminum nitride powder. The sintering temperature of this method is 1,700° C. or less. However, there is a tendency toward staining and the like within the sintered body. In addition, when the circuit substrate is adopted for a semiconducEor element package, there is even the problem that the sealing characteristics deteriorate in the process of glass-sealing a cap onto the base material, the aluminum nitride sintered body, of the circuit substrate.

In addition, Japanese Laid-Open Patent Application No. 82-158178 discloses the provision of high densification and high thermal conductivity in the aluminum nitride sintered body obtained by using a raw material to which at least one type of material selected from elements in group IVa, group Va, group VIa, group VIIa, and group VIII of the periodic table is added to aluminum nitride powder. However, this document discloses nothing about a circuit substrate manufactured by using the disclosed aluminum nitride sintered body or a semiconductor element packages for which the circuit substate is adopted, and the glass-sealing characteristics of this sintered body, in fact, is insufficient.

Moreover, addition of boron and an element selected from the group consisting of titanium, chromium, manganese, iron, cobalt, nickel, copper, zinc, zirconium, molybdenum, cadmium, tin and tungsten is described in Japanese Laid-Open Patent Application No. 4-130064. However, the additives of this case are to improve the coloration or the transmission characteristics of the aluminum nitride, and there is no description about densification or glass-sealing characteristics of the sintered aluminum nitride.

In the above-described circumstances, even with use of a conventional aluminum nitride sintered body as described above, there is still the problem that it is rather difficult to manufacture a circuit substrate having prominent electric properties and a semiconductor package with high durability and reliability.

SUMMARY OF THE INVENTION

Accordingly, an object of the present invention is, with due consideration to the drawbacks of such conventional materials for a substrate of semiconductor devices, to provide a circuit substrate having an insulating layer made from a finely sintered aluminum nitride material with good heat transfer characteristics and with good glass sealing characteristics, and a conductive layer having good, close adhesion to the insulating layer.

The circuit substrate according to the present invention comprises: an insulating layer composed of a sintered aluminum nitride composition comprising aluminum nltride, a first component given by a compound containing an element which is selected from the group consisting of alkaline earth elements and group IIIa elements of the periodic table, a second component given by either a simple boron or a boron compound; and a third component given by either a simple manganese or a manganese compound; and an electrically conductive layer comprising a conductive component given by a metal or an electrically conductive compound for exhibiting electric conductivity, aluminum nitride, said first component, said second component, and said third component.

Moreover, the circuit substrate according to the present invention comprises: an insulating layer composed of a sintered aluminum nitride composition containing a matrix phase comprising particulate aluminum nitride; and a boundary phase interposing in the matrix phase, the boundary phase comprising a compound containing an element which is selected from the group consisting of alkaline earth elements and group IIIa elements of the periodic table, a simple boron or a boron compound, and a simple manganese or a manganese compound; and an electrically conductive layer comprising a conductive component given by a metal or an electrically conductive compound for exhibiting electric conductivity, aluminum nitride, said first component, said second component, and said third component.

The semiconductor device according to the present invention comprises: a circuit substrate having an insulating layer composed of a sintered aluminum nitride composition, comprising: aluminum nitride; a first component given by a compound containing an element which is selected from the group consisting of alkaline earth elements and group IIIa elements of the periodic table; a second component given by a simple boron or a boron compound; and a third component given by a simple manganese or a manganese compound, and an electrically conductive layer comprising: a conductive component given by a metal or an electrically conductive compound for exhibiting electric conductivity; aluminum nitride; said first component; said second component; and said third component; a semiconductor element mounted on the circuit substrate; and a cap being tightly bonded to the circuit substrate with a sealing glass to cover the semiconductor element.

According to the above construction, glass sealing characteristics of the insulating layer is improved with high density, and durability and reliability of the semiconductor device are advanced.

BRIEF DESCRIPTION OF THE DRAWINGS

These and other objects, features and advantages of the present invention will be more clearly understood from the following description of the preferred embodiments of the present invention taken in conjunction with the accompanying drawings, in which identical reference numerals designate the same or similar elements or sections throughout the figures thereof and in which:

FIG. 3 is a fragmentary sectional view showing a modification of the first embodiment of FIG. 2 according to the preent invention;

FIG. 4 is a cross-sectional view showing the second embodiment of the semiconductor device according to the present invention; and FIG. 5 is a cross-sectional view showing the third embodiment of the semiconductor device according to the present invention.

DETAILED DESCRIPTION OF THE PREFERRED EMBODIMENTS

Figure 1:
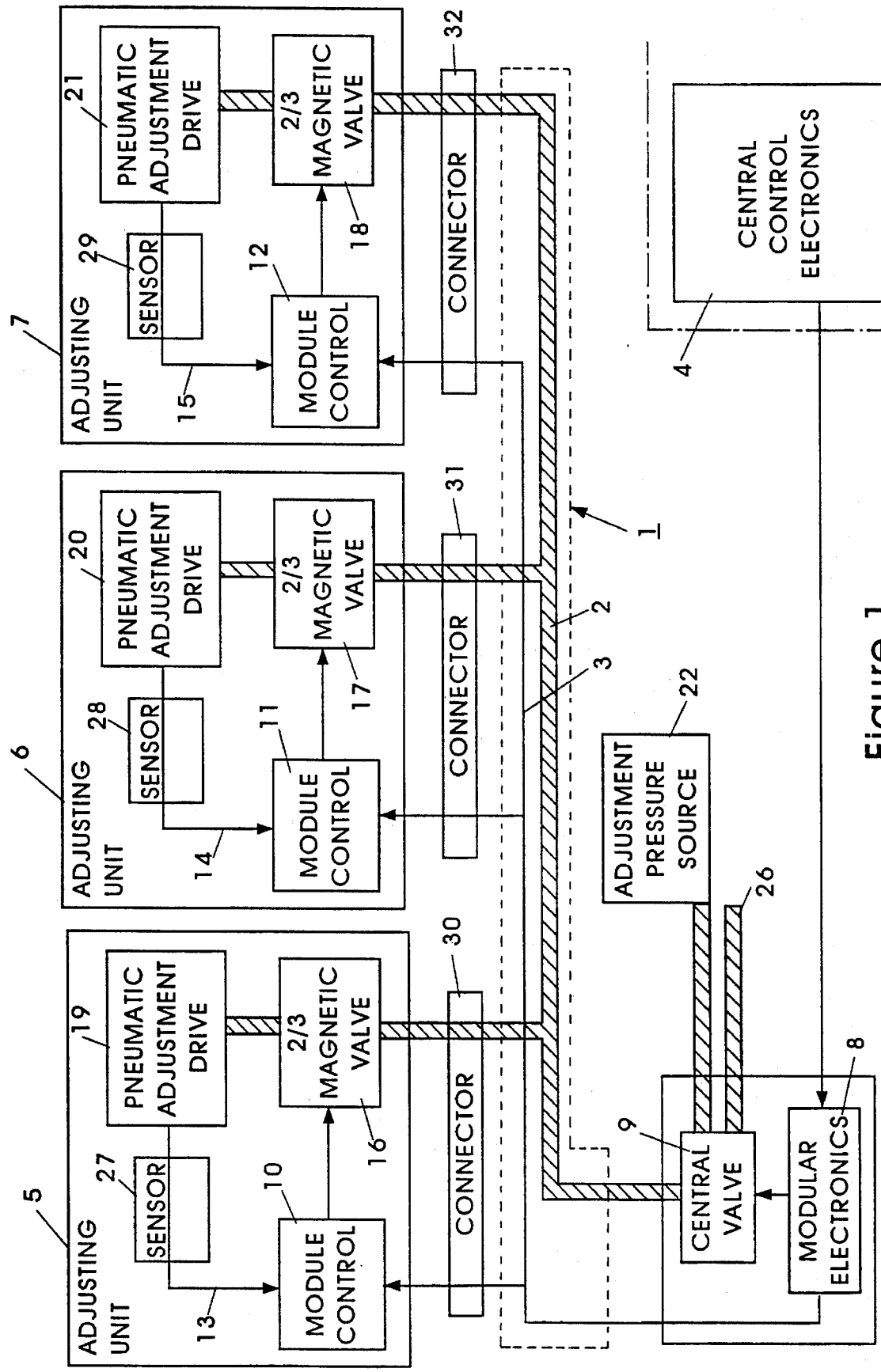
FIG. 1 is a cross-sectional view showing the first embodiment of the semiconductor device according to the present invention.

The present invention will now be explained in detail.

A circuit substrate for which a sintered alminum nitride material is adopted, and a semiconductor device manufactured by using the circuit substrate will now be explained in detail.

In the present invention, two types of the sintered alumium nitride materials (A1, A2) are adopted for the circuit substrate, respectively. The sintered aluminum-nitride material (A1) of the first type contains: aluminum nitride as the main component; at least one element selected from the periodic table group IIa and group IIIa elements; boron or a boron compound; and manganese or a manganese compound. The sintered aluminum nitride material (A2) of the second type contains: aluminum nitride as the main component; at least one element selected from the periodic table group IIa and group IIIa elements; and boron or a boron compound, and it is characterized by the manufacturing process using alumina ($Al_2O_3$) or an aluminum compound which produces alumina during sintering treatment. Both of the sintered materials (A1) and (A2) have a high conductivity of 100 W/m·K or greater, and, in addition, exhibit superior glass sealing characteristics.

The inventors of the present invention consider that these characteristics of the sintered aluminum nitride material (A1) are attributable to the structure which will now be described, as a result of their researches.

Specifically, the sintered aluminum nitride material has a metallographic structure containing aluminum nitride particles and a phase of a compound which is produced from oxide impurities of the aluminum nitride material and the element of IIa or IIIa group of the periodic table, and which is represented by the formula: X—Al—O, wherein the letter Al is aluminum, the letter O is oxygen, and the letter X depicts an element or elements selected from the group IIa elements and the group IIIa elements of the periodic table (this compound often contains two or more different elements for the element X, like as $X^1$–$X^2$—. . . —Al—O, e.g. Y—Ca—Al—O). The boron or boron compound and the manganese or manganese compound contained in the sintered aluminum nitride material are randomly dispersed. Mainly these components are uniformly dispersed in the X—Al—O compound, and are also mixed throughout the aluminum nitride in very small amounts. The X-Al-0 compound and the aluminum nitride particles are present on the surface portion of the sintered aluminum nitride material, and the boron element and the manganese element are present in both the above. If the boron element and the manganese element coexist in this manner, when glass is present on the surface of the sintered aluminum nitride material at a temperature greater than the softening temperature of the glass, the wetting angle of the glass is reduced, and, as a result, the surface of the sintered material is thinly and uniformly wetted with the glass. Also, when boron and manganese are present on the surface of the sintered aluminum nitride material, microbonding occurs with the glass component used for glass sealing, and an interface with good binding characteristics and conformability is formed between them.

The sintered aluminum nitride material (A1) is manufctured, in accordance with the manufacturing method (B1) of the present invention, by sintering the raw material containing: (a) an aluminum nitride powder; (b) at least one element selected from periodic table group IIa and group IIIa elements; (c) boron or boron compound; and (d) manganese or manganese compound. The mixing ratio of each of the components (b), (c) and (d) is settled so that the sintered aluminum nitride material contains it at a preferable amount, respectively, which will be described hereinafter in detail. As a result of this type of method, an aluminum nitride sintered body which is minutely formed, which maintains a desired conductivity, and which is easily sealed in glass, can be produced by low temperature sintering at 1,700° C. or less without incurring an excessive leakage of the additives.

The formation of the fine sintered material sufficiently takes place at a low temperature (1,700° C. or less) in the slntering step for the raw material, by the mutual action of the component (c) and the component (d), or the boron or boron compound and the manganese or manganese compound. In addition, as previously noted, the component (c) and the component (d), as the boron and the manganese on the surface of the sintered aluminum nitride material after sintering, are microbonded with the glass component used for glass sealing, so that the glass sealing characteristics are improved by the formation of an interface with good binding characteristics and conformability between these components.

With use of the sintered aluminum nitride material (A1), the circuit substrate (C1) of the present invention is constructed to comprise: an insulating layer with aluminum nitride as the main component, at least one element selected from periodic table group IIa and group IIIa elements, boron or a boron compound, and manganese or a manganese compound; and a conductive layer containing a single metal substance and/or an electrically conducting compound, aluminum nitride, boron or a boron compound and manganese or a manganese compound, and at least one element selected from the IIa group elements and IIIa group elements of the periodic table. In the circuit substrate, the IIa or IIIa group element is present in the form of a compound represented by the formula: X—Al—O, wherein the letter Al means aluminum, the letter O means oxygen, and the letter X depicts a component or components selected from the group IIa elements and the group IIIa elements of the periodic table (the compound often contains two or more different elements as the component X like as $X^1$–$X^2$—. . . —Al–O). In other words, the circuit substrate (C1) has an insulating layer composed of the sintered aluminum nitride material (A1) and a conductive layer composed of an electrically conducting substance and the elements of the sintered aluminum nitride material (A1). Since the conductive layer contains a component of the same quality as the insulating layer, in particular, manganese, in this type of a circuit substrate (C1), the conductive layer and the insulating layer adhere closely due to production of a compound oxide containing manganese. In addition, because components of the same quality as the insulating layer are contained in the conductive layer, it is possible to adjust the thermal expansion coefficient between the conductive layer and the insulating layer. As a result, a highly reliable circuit substrate with no peeling of the conductive layer from the insulating layer can be produced.

Furthermore, when the insulating layer is made up of the same type of components as the sintered almnum nitride material (A1), the boron element and the manganese element coexist, and the glass is present on the surface at a temperature greater than the softening temperature. The wetting angle of the glass is therefore reduced so that the glass sealing characteristics are good. Accordingly, such a circuit substrate can be effectively utilized in a package in which a cap or the like is joined to the substrate with the glaas component.

The method (D1) for manufacturing the circuit substrate (C1) of the present invention comprises the steps of: forming a first green layer for the insulating layer from the raw material; forming a second green layer for the electrically conductive layer on the first green layer by using a conductive paste; and sintering the first and second green layers to produce the circuit substrate having the insulating layer and the electrically conductive layer. Specifically, a green sheet, for example, is fabricated from the raw material containing (a) the aluminum nitride powder, (b) at least one element selected from the group IIa elements and the group IIia elements of the periodic table, (c) the boron or boron compound, and (d) the manganese or manganese compound blended as a prefered weight. Next, a conductive paste containing: (A) a single metal substance and/or electrically conducting compound; g(B) an aluminum carbide powder; (C) at least one compound which contains an element selected from the elements of group IIa or IIIa group of the periodic table; (D) a boron or boron compound, and (E) a manganese or manganese compound, is prepared and applied to the green sheet in pattern form using a screen printing method or the like in such a manner that the conductive paste forms a desired shape of the conductive layer (wire, etc). Then, further lamination as occasion requires, removal of the binder, and slntering are carried out. Using this type of method (D1) for manufacturing the circuit substrate (C1), the compound oxide containing manganese can be formed in the conductive layer and the insulating layer in the simultaneous slntering process at the low temperature of 1,700° C. or less, making it possible to obtain good close adherence between the conductive layer and the insulating layer from the manganese-containing compound oxide. Also, it is possible to adjust the contraction ratio of the insulating layer and that of the conductive layer in the simultaneous sintering step. As a result, a highly reliable circuit substrate with no peeling of the conductive layer from the insulating layer can be produced.

According to the above method (D1), it is of course possible to form a fine insulating layer with high heat conduction and good glass sealing charateristics in the low temperature simultaneous slntering process, by the same mechanism as explained under the manufacturing method (B1) for the sintered almnum nitride material. Accordingly, the manufactured circuit substrate can be effectively utilized in a package in whlch a cap or the like is joined with the glass component.

In the method (B2) for manufacturing the sintered aluminum nitride material (A2) of the present invention, the raw material to be sintered contains: (a) an aluminum nitride powder; (b) at least one element selected from the group IIa elements and the group IIIa elements of the periodic table; (c) boron or a boron compound; and (d) an alumina powder or an aluminum compound which produces alumina during sintering, and they are mixed before sintering. When using this type of manufacturing method (B2) for the sintered aluminum nitride material (A2), oxygen is supplied from the addition of alumina and a slightly larger amount of oxygen is dissolved in the aluminum. As a result, a lattice deficiency is produced on the aluminum site, the aluminum nitride has a tendency to self disperse, therefore sintering takes place at a low temperature. In addition, a part of the particle boundary phase is converted to glass when the boron or boron compound is.added, and the particle boundary phase component which flows exists at a low temperature in comparison with the case where boron is not added. Therefore, it is possible to obtain a fine sintered body at a low temperature, even when minute pores remain, because of the effect by which that portion is filled with the glass component (liquid pocket effect). As a result, a sintered aluminum nitride material can be produced with a high conductivity of 100 W/m·K or greater. In addition, a sintered aluminum nltride material exhibiting superior glass sealing characteristics can be produced.

As to the structure by which the sintered aluminum nitride material (A2) obtained by this manufacturing method (B2) exhibits superior glass sealing characteristics, the inventors of the present invention, as a result of their researches, consider that these characteristics result from the structure which will now be described.

The boron or boron compound and the alumina blended together as the raw material for the sintered aluminum nitride material are randomly dispersed. Mainly, these materials are uniformly dispersed in the X—Al—O compound, wherein the component X is at least one element of group IIa or group IIIa of the periodic table, and are also mixed throughout the aluminum nitride in very small amounts. The X—Al—O compound and the aluminum nitride particles are present on the surface portion, and the boron element, the aluminum element and the oxygen element are present in both of the X—Al—O compound.and the aluminum nitride particles. If the boron element, the aluminum element and the oxygen element are present, when glass is present on the surface of the sintered aluminum nitride material at a temperature greater than the softening temperature of the glass, the wetting angle of the glass is reduced, and, as a result, the surface is thinly and uniformly wetted with the glass. Also, when boron and manganese are present on the surface of the sintered aluminum nitride material, microbonding occurs with the glass component used for glass sealing, so that an interface with good binding characteristics and conformability is formed between them.

As well as the manufacturing method (D1) for the circuit substrate (C1) mentioned above, the method (D2) for manufacturing the circuit substrate (C2) of the present invention comprises the steps of: forming a first green layer for the insulating layer from the raw material; forming a second green layer for the electrically conductive layer on the first green layer by using a conductive paste; and sintering the first and second green layers to produce the circuit substrate having the insulating layer and the electrically conductive layer. The first green layer is, for example, a green sheet which is fabricated from the raw material containing: (a) an aluminum powder; (b) a compound of group IIa elements of the periodic table or both a compound of group IIa elements and a compound of group IIIa elements of the periodic table, (c) the boron or boron compound, and (d) an alumina powder or an aluminum compound which produces alumina during sintering. The conductive paste is prepared to contain: (A) a single metal substance and/or electrically conducting compound; (B) an aluminum nitride powder; (C) at least one compound containing an element selected from the group IIa elements and the group IIIa elements of the periodic table; (D) a boron or boron compound and (E) an alumina powder or an aluminum compound which produces alumina during sintering. The conductive paste is applied to at least the surface of the green sheet in pattern form, and sintering is then carried out. Using this type of method (D2) for manufacturing the circuit substrate (C2), because the raw materials for the conductive layer contain the same type of components (B) to (E) as the raw materials for the insulating layer, the conductive layer and the insulating layer can have good close adherence resulting from the creation of common compound oxides in these layers in the simultaneous sintering step at the low temperature of 1,700° C. or less. Also, it is possible to adjust the contraction ratio of the insulating layer and that of the conductive layer in the simultaneous sintering process. As a result, a highly reliable circuit substrate with no peeling of the conductive layer from the insulating layer can be produced.

Furthermore, in the low temperature simultaneous sintering step, it is possible to form a fine insulating layer with high heat conduction and good glass sealing characteristics using the same type of procedures as explained under the manufacturing method (B1) for the sintered aluminum nitride material (A1). Accordingly, the manufactured circuit substrate can be effectively utilized in a package in which a cap or the like is joined by the glass component.

More detailed description about the sintered aluminum nitiride materials, the circuit substrates, and the manfuacturing methods thereof will now be made below.

1) Sintered Aluminum Nitride Material (A1) for Insulating Layer of Circuit Substrate This sintered aluminum nitride material contains the aluminum nitride as the main component, and further contains at least one element selected from periodic table group IIa and group IIIa elements. Examples which can be given of the group IIa elements include calcium (Ca), barium (Ba), strontium (St) and the like. Group IIIa elements include scandium (Sc) and yttrium (Y) and rare earth elements such as lanthanides and the like. The group IIa and/or IIIa element can be blended as a simple material or a compound material such as oxide, carbide, carbonate and the like, and it exists, in the sintered material, mainly in the form of a compound which is represented by the formula: X—Al—O, wherein the letter Al is aluminum, the letter O is oxygen, and the letter X depicts the group IIa and/or IIIa element of the periodic table. Preferably, the amount of the group IIa and/or IIIa element contained in the sintered material is such an amount that, assuming the group IIa and/or IIIa element contained is converted into the corresponding oxide, the amount of that oxide is within a range of 0.01 to 18% by weight relative to the amount of the sintered material. If the amount of the group IIa and/or IIIa element is such that the corresponding oxide is less than 0.01% by weight, it is difficult to obtain a finely sintered aluminum nitride material with a high heat conductivity. On the other hand, if the amount of the corresponding oxide exceeds 18% by weight, there is an excessive amount of the component which forms the grain boundary phase in the sintered aluminum nitride material, and the heat conductivity is reduced. A more desirable amount of the group IIa and/or IIIa element contained is such that corresponds to 0.1 to 10% by weight as the oxide, and the most desirable amount is 0.5 to 8% by weight as the oxide.

Moreover, the sintered aluminum nitride material contains boron or a boron compound, and examples of boron compounds include boron oxide ($B_2O_3$), boric acid ($H_3BO_3$), transition metal borides such as titanium boride ($TiB_2$), tungsten boride (WB), zirconium boride ($ZrB_2$), rare earth borides such as lanthanum boride ($LaB_6$), and alkaline earth borides such as calcium boride ($CaB_6$), aluminum borate, yttrium borate, and the like. Preferably, the amount of the boron or boron compound contained in the sintered material is such that, assuming the boron or boron compound contained is converted into the corresponding boron oxide ($B_2O_3$), the amount of the boron oxide is within a range of 0.002 to 4% by weight relative to the amount of the sintered material. (This equally means, the preferable amount of the boron element in the case of containing a simple boron is within a range of 0.0006 to 1.2% by weight. This stipulation as a simple boron is also applicable in the case of a boron compound contained.) If the amount of the corresponding boron oxide of the boron or boron compound contained is less than 0.002% by weight, it is difficult to obtain a fine sintered material with superior glass sealing characteristics. On the other hand, if the amount of the corresponding boron oxide exceeds 4% by weight, there is an excess of the component which forms the grain boundary phase of the sintered aluminum nitride material, the heat conductivity is low, and the surface is roughened with loss of flatness. A more desirable amount of the boron or boron compound contained is such an amount that the corresponding boron oxide is 0.02 to 3% by weight.

Furthermore, the sintered aluminum nitride material contains manganese or a manganese compound, and examples of manganese compounds include manganese oxides (MnO, $MnO_2$), potassium permanganate, manganese carbide, manganese nitride, manganese boride, manganate and the like. Preferably, the amount of the manganese or manganese compound contained in the sintered material is such that, assuming the manganese or manganese compound contained is correspondingly converted into the manganese dioxide ($MnO_2$), the amount of the manganese dioxide is within a range of 0.001 to 4% by weight relative to the amount of the sintered material. (This equally means, the preferable amount of the manganese element in the case of containing simple manganese is within a range of 0.0006 to 2.5% by weight. This stipulation as a simple manganes is also applicable in the case of a manganese compound contained.) If the amount of the corresponding manganese dioxide is less than 0.001% by weight, it is difficult to obtain a finely sintered aluminum nitride material with superior glass sealing characteristics. On the other hand, if the amount of the corresponding manganese dioxide exceeds 4% by weight, not only is there an excess of the compound which forms the grain boundary phase component of the sintered aluminum nitride material and a low heat conductivity, but the surface is roughened with loss of flatness. A more desirable amount of the manganese or manganese compound is such an amount that the corresponding manganese dioxide is 0.008 to 2% by weight.

The boron component especially serves for improving glass sealing characteristics to the sintered materia, and the manganese component works for densification of the sintered material. Here, it is to be noted that, when both the boron component and the manganese component are present in the sintered aluminum nitride material, each of these effects is advanced more, respectively, and a small amount of the boron component such that the corresponding boron oxide is 0.01 to 0.3% by weight relative to the aluminum nitride content is therefore sufficient for imparting excellent glass sealig property.

To color the sintered material or give it high strength as required, the sintered aluminum nitride material of the present invention may contain transition metals such as titanium (Ti), tungsten (W), molybdenum (Mo), tantalum (Ta), niobium (Nb), manganese (Mn) and the like or their oxides, carbides, nitrides, and borides. These component can be added to the aluminum nitride in the range of 0.05 to 1% by weiht as a simple transition metal. In addition, to improve the mechanical strength, silicon compounds such as silicon oxide ($SiO_2$), silicon nitride ($Si_3N_4$) and the like may be added in the range of 1% by weight or less of the aluminum nitride.

2) Method (B1) for Manufacturing Sintered Aluminum Nitride Material (A1)

First, (a) an aluminum nitride powder; (b) at least one compound containing an element which is selected from the group IIa elements and the group IIIa elements of the periodic table, blended at an amount such that, assuming the compound of group IIa and/or IIIa element is convereted into the corresponding oxide, the amount of the corresponding oxide is within a range of 0.01 to 18% by weight to the aluminum nitrider powder; (c) boron or a boron compound, blended at an amount such that, assuming the boron or boron compound is converted into the corresponding boron oxide, the amount of that boron oxide is within a range of 0.002 to 4% by weight to the aluminum nitride powder; (d) and manganese or a manganese compound, blended at an amount such that, assuming the manganese or manganese compound is correspondingly converted into manganese dioxide, the amount of the manganese dioxide is within a range of 0.005 to 4% by weight to the aluminum nitride powder, are blended in a ball mill or the like to prepare the raw material.

It is preferable for the (a) component to use an aluminum nitride powder having an average primary particle diameter of 0.03 to 1.2 µm. The reasons for this are as follows. If the average primary particle diameter of the aluminum nitride powder is less than 0.03 µm, the handling of the powder becomes difficult and there is concern that forming the powder will also be difficult. If the average primary particle diameter of the aluminum nitride powder exceeds 1.2 µm, there is concern that low temperature sintering at 1,700° C. or lower, and in particular at 1,600° C. or lower, will be difficult. Also, there is concern that the dimension of the aluminum nitride particles in the sintered material exceeds 2 µm to reduce the mechanical strength. A more desirable range for the average primary particle diameter of the aluminum nitride powder is 0.5 to 1.0 µm.

Of course, the above stipulation does not mean that the raw material be not contain an aluminum nitride particle having a diameter larger than the above-described range of the average particle diameter (0.03 to 1.2 µm), and an aluminum nitrider powder containing particle diameters larger than 1.2 µm is possibly permitted in the raw material within the stipulation of the average primary particle diameter of the aluminum nitride powder.

It is preferable that the amount of the oxygen impurities in the (a) component, most of which are present in the form of alumina ($Al_2O_3$) at the surface of the aluminum nitride powder, be in the range of 0.2 to 3.5% by weight. The reasons for stipulating the range of oxygen impurities are as follows. If the amount of oxygen impurities is less than 0.2% by weight, sintering at 1,700° C. or lower, and in particular at 1,600° C. or lower, will be difficult, and there is concern that the material will deteriorate because of oxidation of the aluminum nitride powder during the steps of blending and handling the powder prior to sintering. A more desirable amount of oxygen impurities is 0.5 to 2% by weight.

Examples of compounds in periodic table group IIa for the (b) component, include oxides, carbides, oxalates, nitrates, alkoxides and the like of calcium (Ca), barium (Ba), strontium (St) and the like. Compounds in periodic table group IIIa include, for example, oxides, carbides, oxalates, nitrates, alkoxides, halides, nitrides and the like of scandium (Sc), yttrium (Y) and rare earth elements such as lanthanides and the like. These compounds can be used individually or in mixtures of two or more types. The reasons for stipulating the blended amounts of the (b) component are as follows. If the amount of the (b) component is such an amount that the amount of corresponding oxide is less than 0.01% by weight, a fine sintered material of aluminum nitride with a high heat conductivity is not obtained because of the low sintering temperature (1,700° C. or less). If the blended amount of the (b) component is such that the corresponding oxide exceeds 18% by weight, there is an excess of the grain boundary phase component of the resulting aluminum nitride sintered material and the heat conductivity decreases. A more desirable amount of the blended amount of the (b) component is such that the amount of the corresponding oxide is 0.1 to 10% by weight.

Examples of a boron compound, or the (c) component, include boron oxide ($B_2O_3$), boric acid ($H_3BO_3$), transition metal borides such as titanium boride ($TiB_2$), tungsten boride (WB), zirconium boride ($ZrB_2$), rare earth borides such as lanthanum boride ($LaB_6$), alkaline earth borides such as calcium boride ($CaB_6$), borate, and the like. The reasons for stipulating the blended amounts of the (c) component are as follows. If the amount of the (c) component is such an amount that the corresponding oxide is less than 0.002% by weight, it is difficult to obtain a fine sintered material with a high heat conductivity and superior glass sealing characteristics at the low sintering temperature (1,700° C. or less). On the other hand, if the amount of the (c) component converted to an oxide exceeds 4% by weight, there is an excess of the grain boundary phase component of the resulting aluminum nitride sintered body, the heat conductivity is reduced, and the surface is roughened so that flatness is lost. A more desirable amount of the blended (c) component is such that the corresponding oxide is 0.02 to 3% by weight.

Examples of manganese compounds, the (d) component, include manganese oxides (MnO, $MnO_2$), potassium permanganate, manganese carbide, manganese nitride, manganese boride, manganate and the like. The reasons for stipulating the contained amounts of the (c) component are as follows. If the amount of the (c) component is such that the amount of the corresponding oxide is less than 0.005% by weight, it is difficult to obtain a fine aluminum nitride sintered body with superior glass sealing characteristics at the low sintering temperature (1,700° C. or less). On the other hand, if the amount of the (d) component converted to an oxide exceeds 4% by weight, not only is there an excess of the grain boundary phase component of the aluminum nitride sintered body and a low heat conductivity, but the surface is toughened so that flatness is lost. A more desirable amount of the (d) component is 0.008 to 2% by weight as the oxide.

Preferably, the components of (b) to (d) all have an average particle diameter of 5 μm or less, and, more desirably, 4 μm or less.

Also, colorants, transition metals such as Ti, W, Mo, Ta, Nb, Mn and the like, or the oxides, carbides, fluorides, carbonates, oxalates, sulfates, nitrates, and borates may also be blended into the raw material to strengthen the sintered product, as required, in the range of 0.05 to 1% by weight, as the simple transition metal, relative to the amount of the aluminum nitride powder. In addition, aluminum compounds, such as $Al_2O_3$, $AlF_3$, and the like, and phosphorous compounds to effectively reduce the sintering temperature, and silicon compounds such as silicon oxide ($SiO_2$), silicon nitride ($Si_3N_4$) and the like to improve the mechanical strength, may be incorporated in the range of 1% by weight or less to the aluminum nitride powder.

A binder is then added to the raw material, and, after kneading, granulating, and grading, the body is formed. A metal mold press, a cold hydrostatic press, or sheet forming, for example, can be adopted for the forming method. If the body is formed by pressing the mixture, it is preferred to press it so that the pressed body has a density of 1.40 g/cm³. If the density of the pressed body is less than 1.40 g/cm³, pores remains in the body after sintering, due to poor packing of the body. Following the forming of the body, the formed body is heated in an oxygen-free atmosphere, such as in a flow of nitrogen gas, or in an inert atmosphere containing steam, or in air, to remove the binder, and then sintered in an oxygen-free atmosphere at a temperature of 1,400° to 1,700° C., or, preferably, 1,500° to 1,650° C. to produce a sintered aluminum nitride body.

The sintered aluminum nitride body can also be produced by the use of a hot press or a hot hydrostatic press on the raw material instead of sintering at atmospheric pressure.

3) Circuit Substrate (C1)

The circuit substrate (C1) comprises an insulating layer and a conductive layer. The insulating layer contains: aluminume nitride as the main component; at least one element selected from the group IIa elements and the group IIIa elements of the periodic table; boron or a boron compound; and manganese or a manganese compound. The element selected from the group IIa and group IIIa elements of the periodic table, and the boron or boron compound and manganese or manganese compound which are used in the insulating layer are the same as previously explained for the sintered aluminum nitride material (A1). The weights of the components are stipulated for the same reasons as outlined for the sintered aluminum nitride materia (A1).

In other words, the insulating layer has substantially the same composition as the sintered aluminum nitride material (A1). Namely, in the insulating layer, the amount of the group IIa and/or IIIa element contained in the insulating layer, preferably, is such an amount that, assuming the group IIa and/or IIIa element contained is converted into the corresponding oxide, the amount of that oxide is within a range of 0.01 to 18% by weight relative to the amount of the insulating layer; the amount of the boron or boron compound contained in the insulating layer is such that, assuming the boron or boron compound contained is converted into the corresponding boron oxide ($B_2O_3$), the amount of the boron oxide is within a range of 0.002 to 4% by weight relative to the amount of the insulating layer; and the amount of the manganese or manganese compound contained in the insulating layer is such that, assuming the manganese or manganese compound contained is correspondingly converted into the manganese dioxide ($MnO_2$), the amount of the manganese dioxide is within a range of 0.005 to 4% by weight relative to the amount of the insulating layer.

The conductive layer of the circuit substrate (C1) contains: a single metal substance and/or an electrically conducting compound; aluminum nitride; at least one element selected from the group IIa elements and the group IIIa elements of the periodic table; boron or a boron compound; and manganese or a manganese compound. The group IIa and/or IIIa element is present mainly in the form of a compound which is represented by the formula: X—Al—O, wherein the letter X depicts the component which is selected from the group IIa elements and the group IIIa elements of the periodic table. As mentioned before, this compound may contain two or more different elements as the component X like as $X^1$–$X^2$—. . . —Al—O.

Examples of the single metal and the conducting compound contained in the conductive layer include tungsten, tungsten boride, tungsten carbide, tungsten silicide, molybdenum, molybdenum boride, molybdenum carbide, molybdenum silicide, and the like. The single metal and the conducting compound are preferably used in the range of 75 to 99.5% by weight of the conductive layer, and, more preferably, in the range of 80 to 99% by weight of the conductive layer.

The amount of the aluminum nitride contained in the conductive layer is preferably in the range of 0.5 to 20% by weight in order to adjust the heat contraction characteristics of the insulating layer to that of the insulating layer.

The amount of the boron or boron compound contained in the conductive layer is preferably 0.001 to 0.2% by weight, and the amount of the manganese or manganese compound contained in the conductive layer is preferably 0.001 to 0.2% by weight.

As understood from the above description, the conductive layer contains a small amount of the same components as those of the insulating layer as a filler which is added to the electrically conducting component. In accordance with this construction, the circuit substrate has continuity of composition between the insulating layer and the conductive layer. As a result, an interface with good binding characteristics and conformability is formed between them. If the conductive layer does not contain the boron component or the manganese component, the binding characteristics deteriorate to cause peeling of the conductive layer from the insulating layer. However, if the amounts of the boron component and the manganese component exceeeds the above preferable ranges, the electrically conducting component is converted to the boride and the manganese component makes alloy, resulting in the rise of resistance of the conductive layer.

(4) Method (D1) for Manufacturing Circuit Substrate (C1)

First, the raw material containing: (a) an aluminum nitride powder; (b) at least one compound containing an element which is selected from the group IIa elements and the group IIIa elements of the periodic table, blended at an amount such that, assuming the compound of the group IIa and/or IIIa group is converted to the corresponding oxide, the amount of the oxide is within a range of 0.01 to 18% by weight relative to the amount of the aluminum nitride powder; (c) boron or a boron compound, blended at an amount such that, assuming the boron or boron compound is converted into the corresponding boron oxide, the amount of that boron oxide is within a range of 0.002 to 4% by weight to the aluminum nitride powder; and (d) manganese or a manganese compound, blended at an amount such that, assuming the manganese or manganese compound is converted into the corresponding manganese dioxide, the amount of the manganese dioxide is within a range of 0.005 to 4% by weight to the aluminum nitride powder, and an organic binder are dispersed in an organic solvent and prepared in slurry form. A green sheet is then prepared from this slurry using a doctor blade.

The aluminum nitride powder as the (a) component is used in the same manner as previously explained under "2) Method (B1) for Manufacturing Sintered Aluminum Nitride Material (A1)".

The compounds and the like used in the components of (b) to (d) are handled in the same manner as previously explained under "2) Method (B1) for Manufacturing Sintered Aluminum Nitride Material (A1)". The weights of the components of (b) to (d) are stipulated for the same reasons as outlined under "2) Method for Manufacturing Sintered Aluminum Nitride Material".

In addition, (A) the single metal substance and/or electrically conducting compound; (B) the AlN powder; (C) at least one compound containing an element selected from the group IIa elements and the group IIIa elements of the periodic table; (D) the boron or boron compound; and (E) the manganese or manganese compound, and an organic binder are dispersed in an organic solvent and prepared as a conductive paste.

Examples of the (A) single metal substance and/or electrically conducting compound include tungsten, tungsten borlde, tungsten carbide, tungsten silicide, molybdenum, molybdenum boride, molybdenum carbide, molybdenum silicide, and the like. The single metal and the conducting compound are preferably blended so that 75 to 99.5% by weight is contained in the conductive layer formed simultaneously at a later-described slntering step. More preferably, the blended amount of the single metal and the conducting compound is 80 to 99% by weight.

The (B) component, the aluminum nltride powder, is preferably blended so that 0.5 to 20% by weight is contained in the conductive layer formed simultaneously at the later-described slntering process.

The (C) component, the compound of the group IIa and/or IIIa elements of the periodic table, is preferably blended so that, assuming that the (C) component contained in the conductive layer which is formed simultaneously at a later-described sintering step is converted to the corresponding oxide, the amount of the oxide is 0.001 to 3 by weight relative to the amount of the conductive layer.

The (D) component, the boron or boron compound, is preferably blended so that, assuming that the (D) component contained in the conductive layer which is formed simultaneously at the later-described sintering step is converted to the corresponding oxide, the amount of the oxide is 0.001 to 0.2% by weight relative to the amount of the conductive layer.

The (E) component, the manganese or manganese compound, ls preferably blended so that, assuming that the (E) component contained in the conductive layer which is formed simultaneously at the later-described sintering step is converted to the corresponding oxide, the amount of the oxide is 0.001 to 0.2% by weight relative to the amount of the conductive layer.

Then, after applying the conductive paste on at least the surface of the green sheet in pattern form using a screen printing method or the like, the circuit substrate is produced by sintering at 1,400° to 1,700° C., and preferably at 1,500° to 1,650° C., in a non-oxidizing atmosphere of nitrogen or the like.

A multilayered circuit substrate is manufactured by the following type of procedure. First, a plurality of via holes is formed at specified positions on the green sheet for joining the layers, and the paste is filled into the via holes when the conductive paste is applied. In this step, pressure may be applied after the paste is filled into the via holes. Similarly, a plurality of the green sheets with the conductive paste filled in the via holes are formed. The green sheets are then built up in layers so that the via holes are in agreement and hot pressed to form a laminated body, after which the ends are cut off to specified dimension. This laminated body is then heated in a non-oxidizing atmosphere of nitrogen or the like, an atmosphere which contains steam, or an inert atmosphere of argon gas or the like, in order to remove the binder. After the binder has been removed, the multiple layered circuit substrate is produced by sintering at 1,400° to 1,700° C., and preferably at 1,500° to 1,650° C., in a non-oxidizing atmosphere of nitrogen or the like.

5) Method (B2) for Manufacturing Sintered Aluminum Nitride Material (A2)

First, (a) the raw material containing: an aluminum nitride powder; (b) a compound containing an element selected from the group IIa elements of the periodic table or both of a compound of the group IIa element and a compound of the group IIIa element of the periodic table, blended at an amount such that, assuming the (b) component is converted to the corresponding oxide, the amount of the oxide is 0.01 to 18% by weight relative to the aluminum nitride powder; (c) the boron or boron compound blended at an amount such that, assuming the (c) component is converted to boron oxide, the amount of the boron oxide is 0.002 to 4% by weight relative to the aluminum nitride powder; and (d') alumina powder blended at an amount of 0.01 to 5% by weight of the aluminum nitride powder, or an aluminum compound which produces alumina during sintering, blended at an amount such that, assuming the aluminum compound is converted to alumina, the amount of the converted alumina is 0.01 to 5% by weight relative to the aluminum nitride powder, are blended to prepare the raw material, using a ball mill or the like.

The aluminum nitride powder as the (a) component is used in the same manner as previously explained under "2) Method (B1) for Manufacturing Sintered Aluminum Nitride Material (A1)".

The compounds of the periodic table group IIa and IIIa elements, the (b) component, is handled in the same manner as previously explained under "2) Method (B1) for Manufacturing Sintered Aluminum Nitride Material (A1)". The reasons for stipulating the weight of the (b) component are the same reasons as outlined under "2) Method (B1) for Manufacturing Sintered Aluminum Nitride Material (A1)".

The boride compound which is the (c) component is handled in the same manner as previously explained under "2) Method (B1) for Manufacturing Sintered Aluminum Nitride Material (A1)". The reasons for stipulating the weight of the (c) component are the same reasons as outlined under "2) Method (B1) for Manufacturing Sintered Aluminum Nitride Material (A1)".

Examples of the aluminum compound converted to alumina by sintering, which is the (d') component, include aluminum hydroxide, aluminum fluoride, aluminum nitrate, and the like.

The reasons for stipulating the blended amounts of the (d') component are as follows. If the amount of the (d') component is such an amount that the amount of the corresponding oxide is less than 0.01% by weight, it is difficult to obtain a finely-sintered aluminum nitride material with high heat conductivity and superior glass sealing characteristics at a low sintering temperature (1,700° C. or less). On the other hand, if the amount of the (d') component is such that the oxide exceeds 5% by weight, there is an excess of the grain boundary phase component of the sintered aluminum nitride and a low heat conductivity. A more desirable amount of the (d') component is such that the oxide is 0.1 to 3% by weight.

The components of (b), (c) and (d') all have an average particle diameter of 5 μm or less, and, more desirably, 4 μm or less.

Various types of additives are permitted in the raw material, in the same manner as previously explained under "2) Method for Manufacturing Sintered Aluminum Nitride Material".

A binder is then added to the raw material, and, after kneading, granulating, and grading, the body is formed. A metal mold press, a cold hydrostatic press, or sheet forming, for example, can be adopted as the forming method. Following this, the formed body is heated in a non-oxidizing atmosphere, such as in a flow of nitrogen gas, or in an atmosphere containing steam, an atmosphere of inert gas such as argon or the like, or in air, in order to remove the binder. After the binder is removed, the sintered aluminum nitride body is produced by sintering in a non-oxidizing atmosphere at a temperature of 1,400° to 1,700° C., or, preferably, 1,500° to 1,650° C. During the sintering, the (d') component reacts with the (b) component to produce the compound represented by the formula: X—Al—O, as previously described.

The sintered aluminum nitride body can also be produced by the use of a hot press or a hot hydrostatic press (HIP) for sintering the raw material.

6) Method (D2) for Manufacturing Circuit Substrate (C2)

First, the raw material containing: (a) an aluminum nitride powder; (b) a compound of a group IIa element of the periodic table, or both of a compound of the group IIa element and a compound of the group IIIa element of the periodic table, blended at an amount such that, assuming the (b) component is converted to the corresponding oxide, the amount of the corresponding oxide is within a range of 0.01 to 18% by weight relative to the amount of the aluminum nitride powder; (c) boron or a boron compound blended at an amount such that, assuming the boron or boron compound is converted to boron oxide, the amount of that boron oxide is 0.02 to 4% by weight of the aluminum nitride powder; and (d') an alumina powder blended at 0.01 to 5% by weight to the aluminum nitride powder, or an aluminum compound which is converted to alumina during sintering, blended at an amount such that, assuming the aluminum compound is converted to alumina, the amount of the converted alumina is 0.01 to 5% by weight to the aluminum nitride powder, and an organic binder are dispersed in an organic solvent and prepared in slurry form. A green sheet is then prepared from this slurry using a doctor blade.

The aluminum nitride powder as the (a) component is used in the same manner as previously explained under "2) Method (B1) for Manufacturing Sintered Aluminum Nitride Material (A1)".

The compounds and the simple substances used in the components (b) and (c) are handled in the same manner as previously explained under "2) Method (B1) for manufacturing AlN sintered body (A1)". The weights of the components (b) and (c) are stipulated for the same reasons as outlined under "2) Method (B1) for Manufacturing Sintered Aluminum Nitride Material (A1)".

Examples of the (d') component, an aluminum compound which is converted to alumina during sintering, include aluminum hydroxide, aluminum fluoride, aluminum nitrate, and the like.

The blended weights of the (d') component are stipulated for the same reasons as outlined under "5) Method (B2) for Manufacturing Sintered Aluminum Nitride Material (A2)".

In addition, (A) a single metal substance and/or conductive compound; (B) an aluminum nitride powder; (C) at least one compound containing an element selected from the group IIa elements and the group IIIa elements of the periodic table; (D) boron or a boron compound; and (E') an alumina powder or an aluminum compound which is converted to alumina during sintering, and an organic binder are dispersed in an organic solvent and prepared as a conductive paste.

Examples of the (A) component, the single metal substance and/or conductive compound, include tungsten, tungsten boride, tungsten carbide, tungsten silicide, molybdenum, molybdenum boride, molybdenum carbide, molybdenum silicide, and the like. The single metal and the conductive compound are preferably blended so that 75 to 99.5% by weight is contained in the conductive layer, formed simultaneously at a later-described sintering step.

The (B) component, the aluminum nitride powder, is preferably blended so that 0.5 to 20% by weight is contained in the conductive layer, formed simultaneously at a later-described sintering step.

The (C) component, a compound of the group IIa element of the periodic table or both a compound of the group IIa element and a compound of the group IIIa element of the periodic table, is preferably blended so that, assuming the (C) component contained in the conductive layer which is formed simultaneously at a later-described sintering step is converted to the corresponding oxide, the amount of that oxide is 0.001 to 3% by weight relative to the amount of the conductive layer.

The (D) component, the boron or boron compound, is preferably blended so that, assuming the (D) component contained in the conductive layer which is formed simultaneously at a later-described sintering step is converted to the corresponding oxide, the amount of that oxide is 0.001 to 0.2% by weight relative to the amount of the conductive layer.

The (E') component, the alumina powder or the aluminum compound which is converted to alumina during sintering, is preferably blended so that the amount of alumina powder added or the amount of the alumina which is produced from the added aluminum compound is 0.01 to 2% by weight relative to the amount of the conductive layer which is formed simultaneously at a later-described sintering step.

Then, after applying the conductive paste to at least the surface of the green sheet in pattern form using a screen printing method or the like, and heating in a non-oxidizing atmosphere of nitrogen or argon, or in a non-oxidizing atmosphere of air containing steam or argon to remove the binder, the circuit substrate is produced by sintering at 1,400° to 1,700° C., and preferably at 1,500° to 1,650° C., in a non-oxidizing atmosphere of nitrogen or the like.

A multilayered circuit substrate is produced by the same procedure as previously described under "4) Method (D1) for Manufacturing Circuit Substrate (C1)".

Preferred embodiments of packing of the semiconductor device to which the above-described circuit substrate is used according to the present invention are now described below, with referring to the drawings.

Figure 2:
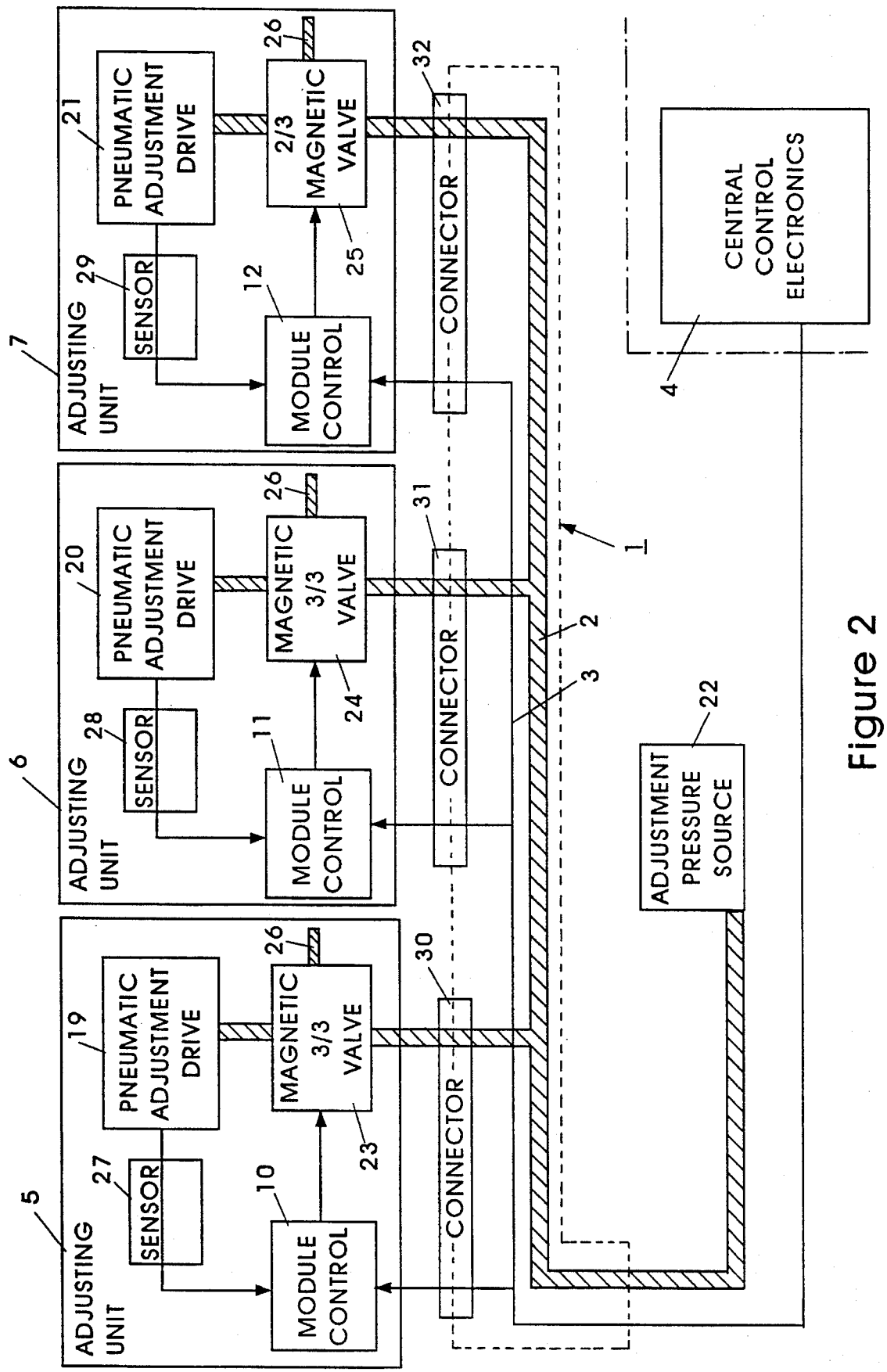
FIG. 2 is a sectional view of the semiconductor device of FIG. 2, taken along a line II—II.

FIGS. 1 and 2 show the first embodiment of the semiconductor device. In this embodiment, the semiconductor device 1 has a circuit substrate 3 on which a semiconductor element 5 such as an LSI, a power IC and the like is mounted. The circuit substrate 3 comprises a multilayered AlN portion 7 composed of a plurality of insulating layers 9 and a wiring pattern portion constructed as a plurality of wires 11. The wiring pattern portion is bonded to the semiconductor element 5 with bonding wires 13. Moreover, a plurality of lead pins 15 are provided on the circuit substrate 3 at the opposite side to the semiconductor element 5, and they are bonded to the wires 11 of the wiring pattern portion with a silver solder or the like, respectively, so that the semiconductor element is electrically connected to the lead pins through the wires 11.

In addition, a cap 17 made of a heat conducting material is mounted on the circuit substrate 3 so as to close the semiconductor element 5 in the cap 17. For the heat conducting material, metals and a specific kind of ceramic materials like aluminum nitride, etc. are generally utilized. The cap 17 is adhered to the circuit substrate 3 with a glass to seal the semiconductor device 1. On the top of the cap 17 attached is a cooling fin 25 which is made of a heat conducting material, e.g. metals, etc., for radiating the heat generated on the semiconductor element 5.

The multilayered AlN portion 7 is formed with the sintered aluminum nitride material described above according to the present invention, and the wiring pattern portion corresponds to the conductive layer of the present invention which is described above. Each wire 11 of the wiring pattern portion has an inner wire 19 which passes through the multilayered AlN portion 7 and an outer wire 21 which is located on the surface of the circuit substrate 3. The inner wire 19 can be produced by making a via hole 28 in the green sheet for the insulating layer 9 and filling the via hole 23 with the conductive paste as previously described, before sintering the multilayered green body. The outer wire 21 can be produced by applying the conductive paste on the green sheet for the insulating layer 9 in pattern form using a screen printing method or the like, before the sintering. Therefore, it will be able to easily understand that the circuit substrate 3 can be manufactured by the same procedure as previously described under "4) Method (D1) for Manufacturing Circuit Substrate (C1)".

In the above embodiment, the semiconductor device is constructed in such a manner that the cap 17 is glass-sealed to the circuit substrate 3 at an appropriate ratio of the bonding surface relative to the over-all mounting surface of the substrate.

FIG. 3 shows a modification of the first embodiment. Specifically, a plurality of projections 29 made of a solder are provided on the semiconductor device 27, instead of the lead pins 15, which are connected to the wires 11.

FIG. 4 shows the second embodiment of the semiconductor device. In this semiconductor device 31, the semiconductor element 5 and the lead pins 15 are arranged at the same side of the circuit substrate 33 so that the semiconductor element 5 is received in a cavity 35 which is formed at the central portion of the mounting surface of the circuit substrate 33. The semiconductor element 5 is closed in the cavity 35 with a metal lid 37 which is adhered to the circuit substrate 33 with a sealing glass. The wiring pattern portion or wires 41, passing through the insulating portion 39, is made from the conductive paste and connects the lead pins 15 and the semiconductor element 5.

FIG. 5 shows the third embodiment of the semiconductor device. In this semiconductor device 43, the semiconductor element 5 is received in a cavity 45 which is formed opposite to the lead pins 15. The wiring pattern portion 47 of the circuit substrate 49 has an earth wire 51 for ground connection, as well as the wires 53 for electrically connecting the semiconductor element 5 and the lead pins 15. A metal cap 55 made of coral, 42 % nickel alloy or the like is adhered to the circuit substrate 49 with a sealing glass to seal the semiconductor device 43, enclosing the semiconductor element 5.

Other features of this invention will become apparent in the course of the following description of exemplary embodiments which are given for illustration of the invention and are not intended to be limiting thereof.

EXAMPLES

Examples according to the present invention will now be explained in detail based on experimental results.

(Example 1)

n-butanol was added to a mixture of 95.5% by weight of AlN powder (containing 0.98% by weight of oxygen impurities) of an average primary particle diameter of 0.6 μm, 3.0% by weight of $Y_2O_3$ (purity: 99.9% by weight) of an average particle diameter of 0.1 μm, 0.5% by weight of $MnO_2$ (purity: 99.9% by weight) of an average particle diameter of 3 μm, 0.5% by weight of $B_2O_3$ of an average particle diameter of 3 μm, and 0.5% by weight of $WO_3$ as a colorant. Then, after breaking up and mixing in a wet ball mill, the n-butanol was removed, resulting in a raw material powder. Next, 5% by weight of an acrylic binder was added to the raw material which was then granulated. After the granulation, the granulated powder was formed into a concave compact under a uniaxial pressure of 50 MPa. This compact was heated to 700° C. in an atmosphere of nitrogen gas to remove the acrylic binder. The binder-less compact was set in a sintering setter made of an AlN sintered material and placed in a graphite furnace in an atmosphere of nitrogen gas under a pressure of one atm., then sintered for six hours at 1700° C.

The resulting AlN sintered concave body was black and exhibited no color irregularities or baking blemishes, and, in addition, had a clean surface. The density was measured at 3.30 g/cm$^3$, using Archimedes method, and the material was suitably fine. A disk with a diameter of 10 mm and a thickness of 3 mm was cut from the AlN sintered body. The thermal conductivity was measured at a room temperature of 21±2° C. using a laser flash method conforming to JIS(Japanese Industrial Standard)-R1611, and the result of measurement was 160 W/mK.

In addition, two concave AlN sintered bodies were produced in accordance with the above-mentioned method. The two resulting concave AlN sintered bodies were piled so that the open surfaces were in contact, and they were sealed in glass under a nitrogen atmosphere using a glass of the following composition.

| | | | |
|---|---|---|---|
| $SiO_2$ | 6.60 wt %, | $TiO_2$ | 5.30 wt % |
| $Al_2O_3$ | 1.80 wt %, | $Fe_2O_3$ | 0.08 wt % |
| $Cr_2O_3$ | 0.08 wt %, | PbO | 57.7 wt % |
| CoO | 0.02 wt %, | CaO | 1.00 wt % |
| MgO | 0.03 wt %, | $Na_2O$ | 0.01 wt % |
| $B_2O_3$ | 6.40 wt %, | ZnO | 19.0 wt % |
| $SnO_2$ | 0.01 wt %, | $V_2O_3$ | 0.30 wt % |
| $Bi_2O_3$ | 1.50 wt %. | | |

The sealed sample was allowed to stand for 40 min in a chamber filled with helium gas at five arm. Then, the chamber was evacuated to a pressure in the order of 10$^{-3}$ torr, and air at atmospheric pressure was reintroduced into the chamber. This helium cleaning treatment was repeated three times, then the sample was removed from the chamber and allowed to stand in air for 30 min. After this process, a helium leak test (fine leak detection) was performed. The amount of leaking helium was detected by a mass spectrometer. A good value of 1.0×10$^{-10}$ atm·cc·s$^{-1}$ or less was obtained as a result. The sample was then inserted into a liquid (Florinat No. 40 manufactured by Minesota Mining and Manufacturing Co., St. Paul, Minn) and warmed to 120° C. for three minutes to test for gross leaks. No bubbles were created and it was confirmed that no gross leaks were present.

(Comparative Example 1)

n-butanol was added to a mixture of 96.5% by weight of the AlN powder of the first example, 3.0% by weight of $Y_2O_3$ (purity: 99.9% by weight) of an average particle diameter of 0.1 μm, and 0.5% by weight of $WO_3$ as a colorant. Then, after breaking up and mixing in a wet ball mill, the n-butanol was removed, to produce a raw material powder. Next, an AlN sintered body was prepared from this raw material powder using the same process as for the first example.

The density and thermal conductivity of the resulting AlN sintered body were measured in the same manner as for the first example. The results showed a density of 3.30, and the material was suitably fine. The thermal conductivity was 150 W/m·K. Good surface conditions were also obtained. However, the leak test indicated a large leak of 5.0×10$^{-7}$ atm·cc·s$^{-1}$ using the same method as for the first example.

(Examples 2 to 27)

Using mixed powders composed of the AlN powders and the various additives shown in the following Tables 1—1 and 1-2, with the sintering conditions variously set as shown in Tables 2-1 and 2—2, twenty six types of AlN sintered bodies were prepared using the same method as for the first example. The results of the densities, thermal conductivity, surface conditions, and helium leaks are also shown in Tables 2-1 and 2—2. Here, as to judgement of the surface conditions, "good" in the tables indicates that there were no color irregularities or baking blemishes and no deposit were observed visually on the surface.

(Blank Tests 1 and 2 for observation of synergism)

Using mixed powders composed of the AlN powders and the additives shown in the following Table 1-2, with the sintering conditions set as shown in Table 2—2, AlN sintered bodies were prepared using the same method as for the first example. The results of the densities, thermal conductivity, surface conditions, and helium leaks are also shown in Table 2—2.

TABLE 1-1

| Example No. | Particle Diameter of AlN(μm) | Element of Group IIa or IIIa (wt %) | | B or B Compound (wt %) | | Mn or Mn Compound (wt %) | | Colorant (wt %) | | Other Additives (wt %) | |
|---|---|---|---|---|---|---|---|---|---|---|---|
| 1 | 0.6 | $Y_2O_3$ | 3.0 | $B_2O_3$ | 0.5 | $MnO_2$ | 0.5 | $WO_3$ | 0.5 | — | |
| 2 | 0.1 | $Y_2O_3$ | 0.05 | $B_2O_3$ | 2.0 | $MnO_2$ | 3.0 | $WO_3$ | 0.5 | — | |
| 3 | 0.8 | $Y_2O_3$ | 15.0 | $B_2O_3$ | 0.05 | $MnO_2$ | 0.05 | $TiO_2$ | 0.5 | $Al_2O_3$ | 2.0 |
| 4 | 0.6 | $Yb_2O_3$ | 0.5 | $B_2O_3$ | 0.5 | $MnO_2$ | 0.5 | $WO_3$ | 0.5 | $Al_2O_3$ | 0.5 |
| 5 | 0.6 | $Dy_2O_3$ | 0.5 | $B_2O_3$ | 1.0 | $MnO_2$ | 0.4 | W | 0.3 | $Al_2O_3$ | 0.5 |
| 6 | 0.6 | $Ho_2O_3$ | 3.0 | $B_2O_3$ | 2.0 | $MnO_2$ | 0.5 | $TiO_2$ | 0.4 | — | |
| 7 | 0.07 | $Y_2O_3$ | 3.0 | $H_3BO_3$ | 1.0 | $MnO_2$ | 0.5 | $WO_3$ | 0.5 | — | |
| 8 | 0.3 | $Y_2O_3$ $Yb_2O_3$ | 3.0 2.0 | $H_3BO_3$ | 1.0 | MnO | 0.5 | $WO_3$ | 0.5 | — | |
| 9 | 2.0 | $Y_2O_3$ $Yb_2O_3$ $Dy_2O_3$ | 0.1 1.0 1.0 | $H_3BO_3$ | 1.0 | $MnO_2$ | 0.5 | $MnO_3$ | 0.5 | $Al_2O_3$ | 0.5 |
| 10 | 0.6 | $Y_2O_3$ | 4.0 | B | 0.5 | $MnO_2$ | 0.2 | TaN | 0.5 | — | |
| 11 | 0.6 | $Y_2O_3$ | 2.0 | B | 0.2 | Mn | 0.5 | NbN | 0.5 | — | |
| 12 | 0.6 | $Y_2O_3$ | 5.0 | B | 1.0 | Mn | 1.0 | $TiO_2$ | 0.5 | — | |
| 13 | 0.1 | $CaCO_3$ | 1.0 | $B_2O_3$ | 0.2 | $MnO_2$ | 3.0 | $WO_3$ | 0.5 | — | |

TABLE 1-2

| Example No. | Particle Diameter of AlN(μm) | Element of IIa or IIIa Group (wt %) | | B or B Compound (wt %) | | Mn or Mn Compound (wt %) | | Colorant (wt %) | | Other Additives (wt %) | |
|---|---|---|---|---|---|---|---|---|---|---|---|
| 14 | 0.8 | CaO | 0.5 | $B_2O_3$ | 0.05 | $MnO_2$ | 0.05 | $TiO_2$ | 0.5 | $Al_2O_3$ | 2.0 |
| 15 | 0.6 | BaO | 1.0 | $B_2O_3$ | 0.5 | $MnO_2$ | 0.5 | $WO_3$ | 0.5 | $Al_2O_3$ | 0.5 |
| 16 | 0.6 | MgO | 1.0 | $B_2O_3$ | 0.2 | $MnO_2$ | 0.4 | W | 0.3 | $Al_2O_3$ | 0.5 |
| 17 | 0.6 | $CaC_2$ | 1.0 | $B_2O_3$ | 2.0 | $MnO_2$ | 0.5 | TiN | 0.4 | — | |
| 18 | 0.07 | CaO | 1.0 | $H_3BO_3$ | 1.0 | $MnO_2$ | 0.5 | $WO_3$ | 0.5 | — | |
| 19 | 0.3 | $CaCO_3$ | 0.5 | $H_3BO_3$ | 1.0 | MnO | 0.5 | $WO_3$ | 0.5 | — | |
|  |  | $CaC_2$ | 0.5 |  |  |  |  |  |  |  |  |
| 20 | 2.0 | $CaCO_3$ | 0.5 | $H_3BO_3$ | 1.5 | $MnO_2$ | 0.5 | $MoO_3$ | 0.5 | $Al_2O_3$ | 0.5 |
|  |  | $CaC_2$ | 0.3 |  |  |  |  |  |  |  |  |
|  |  | CaO | 0.1 |  |  |  |  |  |  |  |  |
|  |  | $BaCO_3$ | 0.1 |  |  |  |  |  |  |  |  |
| 21 | 0.6 | $CaCO_3$ | 0.5 | B | 0.6 | $MnO_2$ | 0.2 | TaN | 0.5 | — | |
| 22 | 0.6 | $CaCO_3$ | 1.0 | B | 0.2 | Mn | 0.5 | NbN | 0.5 | — | |
| 23 | 0.6 | $CaCO_3$ | 2.0 | B | 1.2 | Mn | 1.0 | $TiO_2$ | 0.5 | — | |
| 24 | 0.6 | $Y_2O_3$ | 3.0 | WB | 2.8 | $MnO_2$ | 0.5 | $WO_3$ | 0.3 | — | |
| 25 | 0.6 | $CaCO_3$ | 1.0 | $TiB_2$ | 0.5 | $MnO_2$ | 1.0 | $WO_3$ | 0.3 | $Al_2O_3$ | 2.0 |
| 26 | 0.5 | $Y_2O_3$ | 3.0 | $LaB_6$ | 0.4 | MnO | 0.5 | $WO_3$ | 0.3 | — | |
| 27 | 0.5 | $CaCO_3$ | 1.0 | $CaB_6$ | 0.2 | Mn | 0.2 | $WO_3$ | 0.3 | $Al_2O_3$ | 2.0 |
| Blank Test |  |  |  |  |  |  |  |  |  |  |  |
| 1 | 0.6 | $Y_2O_3$ | 3.0 | — |  | $MnO_2$ | 0.5 | $WO_3$ | 0.5 | — | |
| 2 | 0.6 | $Y_2O_3$ | 3.0 | $B_2O_3$ | 0.5 | — |  | $WO_3$ | 0.5 | — | |

TABLE 2-1

| | Sintering | | Sintered Product | | | |
|---|---|---|---|---|---|---|
| Example No. | Temp. (°C.) | Time (hr) | Density (g/cm³) | Thermal Conductivity(W/m · K) | Surface Condition | Helium Leak (atm · cc/s) |
| 1 | 1700 | 6 | 3.30 | 160 | good | $<1.0 \times 10^{-10}$ |
| 2 | 1500 | 6 | 3.28 | 125 | good | $<1.0 \times 10^{-10}$ |
| 3 | 1700 | 6 | 3.39 | 160 | good | $<1.0 \times 10^{-10}$ |
| 4 | 1680 | 12 | 3.33 | 165 | good | $<1.0 \times 10^{-10}$ |
| 5 | 1700 | 6 | 3.33 | 160 | good | $<1.0 \times 10^{-10}$ |
| 6 | 1700 | 6 | 3.33 | 155 | good | $<1.0 \times 10^{-10}$ |
| 7 | 1400 | 24 | 3.30 | 130 | good | $<1.0 \times 10^{-10}$ |
| 8 | 1550 | 12 | 3.30 | 135 | good | $<1.0 \times 10^{-10}$ |
| 9 | 1800 | 6 | 3.30 | 180 | good | $<1.0 \times 10^{-10}$ |
| 10 | 1700 | 4 | 3.32 | 160 | good | $<1.0 \times 10^{-10}$ |
| 11 | 1680 | 12 | 3.30 | 155 | good | $<1.0 \times 10^{-10}$ |
| 12 | 1720 | 2 | 3.33 | 165 | good | $<1.0 \times 10^{-10}$ |
| 13 | 1550 | 6 | 3.26 | 125 | good | $<1.0 \times 10^{-10}$ |

TABLE 2-2

| | Sintering | | Sintered Product | | | |
|---|---|---|---|---|---|---|
| Example No. | Temp. (°C.) | Time (hr) | Density (g/cm³) | Thermal Conductivity(W/m · K) | Surface Condition | Helium Leak (atm · cc/s) |
| 14 | 1720 | 6 | 3.26 | 155 | good | $<1.0 \times 10^{-10}$ |
| 15 | 1670 | 12 | 3.26 | 165 | good | $<1.0 \times 10^{-10}$ |
| 16 | 1690 | 6 | 3.26 | 155 | good | $<1.0 \times 10^{-10}$ |
| 17 | 1720 | 6 | 3.26 | 155 | good | $<1.0 \times 10^{-10}$ |
| 18 | 1400 | 24 | 3.26 | 135 | good | $<1.0 \times 10^{-10}$ |
| 19 | 1600 | 12 | 3.26 | 130 | good | $<1.0 \times 10^{-10}$ |
| 20 | 1800 | 6 | 3.25 | 180 | good | $<1.0 \times 10^{-10}$ |
| 21 | 1720 | 4 | 3.26 | 155 | good | $<1.0 \times 10^{-10}$ |
| 22 | 1700 | 12 | 3.26 | 150 | good | $<1.0 \times 10^{-10}$ |
| 23 | 1700 | 2 | 3.26 | 165 | good | $<1.0 \times 10^{-10}$ |
| 24 | 1650 | 6 | 3.38 | 160 | good | $<1.0 \times 10^{-10}$ |
| 25 | 1600 | 6 | 3.33 | 155 | good | $<1.0 \times 10^{-10}$ |
| 26 | 1650 | 6 | 3.33 | 168 | good | $<1.0 \times 10^{-10}$ |
| 27 | 1600 | 6 | 3.29 | 156 | good | $<1.0 \times 10^{-10}$ |

TABLE 2-2-continued

| | Sintering | | Sintered Product | | | |
|---|---|---|---|---|---|---|
| Example No. | Temp. (°C.) | Time (hr) | Density (g/cm³) | Thermal Conductivity(W/m · K) | Surface Condition | Helium Leak (atm · cc/s) |
| Blank Test | | | | | | |
| 1 | 1700 | 6 | 3.30 | 145 | good | $1.0 \times 10^{-10}$ |
| 2 | 1700 | 6 | 3.30 | 143 | good | $1.0 \times 10^{-10}$ |

As clearly shown in Tables 2-1 and 2—2, the AlN sintered bodies of Examples 2 to 27 exhibit high density and high heat conductance, as well as good surface conditions and superior glass sealing characteristics.

(Example 28)

By a wet method using a ball mill, 95.5% by weight of AlN powder (containing 0.98% by weight of oxygen impurities) of an average primary particle diameter of 0.6 μm, 3.0% by weight of $Y_2O_3$ (purity: 99.9% by weight) of an average particle diameter of 0.1 μm, 0.5% by weight of $MnO_2$ of an average particle diameter of 0.3 μm, 0.5% by weight of $B_2O_3$ of an average particle diameter of 3 μm, and 0.5% by weight of $WO_3$ as a colorant were mixed into n-butanol. This mixed powder and an organic binder were dispersed in an organic solvent to prepare a slurry. The resulting slurry was formed into sheets according to the doctor blade method and a plurality of green sheets was formed. Next, a plurality of via holes for joining the layers were formed in specified positions in these green sheets.

In an organic solvent with an organic binder dispersed were 85% by volume of a tungsten powder of an average particle diameter of 0.4 μm and 15% by volume of a mixed powder made up of 96% by weight of AlN powder of an average particle diameter of 0.6 μm, 3.0% by weight of $Y_2O_3$, 0.5wt % of $MnO_2$ and 0.5 wt % of $B_2O_3$, to prepare a conductive paste.

Next, the conductive paste was filled into the via holes in the green sheets by screen printing the surface to form layers of the conductive paste. Then, the green sheets formed layers of the conductive paste were laminated so that the positions of the via holes conformed, and hot pressing was implemented. Next, the resulting laminated body was heated to 800° C. in a nitrogen atmosphere containing wet steam to eliminate the organic binder. The binder-free body was sintered for 8 hr at 1680° C. in a non-oxidizing environment of $N_2$ or the like. As a result, a ceramic circuit substrate was produced, exhibiting a multilayer wiring structure wherein electricity passed between the conductive layers through the via holes.

The insulating layer of this ceramic circuit substrate was sufficiently dense that pores could not be seen.

The circuit substrate had a smooth surface which exhibited no warping, undulation, cracks, or swelling. When the shape of the circuit substrate was observed by an SEM, the insulating layer with AlN as the main component and the conductive layer with W as the main component were judged to be sufficiently fine.

Two concave AlN sintered bodies with the same components as the insulating layer were produced in the same manner as in the first example. After the two resulting concave AlN sintered bodies were piled so that the open surfaces were in contact, samples were fabricated by sealing these sintered bodies in glass, in a nitrogen atmosphere, using a glass of the following composition.

| | | | |
|---|---|---|---|
| $SiO_2$ | 6.60 wt %, | $TiO_2$ | 5.30 wt % |
| $Al_2O_3$ | 1.80 wt %, | $Fe_2O_3$ | 0.08 wt % |
| $Cr_2O_3$ | 0.08 wt %, | PbO | 57.7 wt % |
| CoO | 0.02 wt %, | CaO | 1.00 wt % |
| MgO | 0.03 wt %, | $Na_2O$ | 0.01 wt % |
| $B_2O_3$ | 6.40 wt %, | ZnO | 19.0 wt % |
| $SnO_2$ | 0.01 wt %, | $V_2O_3$ | 0.30 wt % |
| $Bi_2O_3$ | 1.50 wt %. | | |

The resulting sample was tested for leaks in the same manner as in the first example. Good values of $1.0 \times 10^{-10}$ atm·cc·s$^{-1}$ or less were obtained as a result. Also, the sample was inserted into a liquid (Florinat No. 40 manufactured by Minesota Minig and Manufacturing Co., St. Paul, Minn.) and warmed to 120° C. for three minutes to test for gross leaks. No bubbles were created and it was confirmed that no gross leaks were present.

(Examples 29 to 44)

Using mixed powders composed as shown in the following Table 3 for the insulation layer mixture, and using mixed powders composed as shown in the following Table 4 for the conductive layer mixture, the sintering conditions were set as shown in Table 5, and sixteen types of ceramic circuit substrates of a multilayer wiring structure were prepared using the same method as for Example 28.

The surface shapes of each of the resulting ceramic circuit substrates were examined. In addition, two concave AlN sintered bodies with the same components as each of the insulating layer were produced in the same manner as in the first example. After the two resulting concave AlN sintered bodies were piled so that the open surfaces were in contact, samples were fabricated by sealing these sintered bodies in glass, in a nitrogen atmosphere, using a glass of the following composition.

| | | | |
|---|---|---|---|
| $SiO_2$ | 6.60 wt %, | $TiO_2$ | 5.30 wt % |
| $Al_2O_3$ | 1.80 wt %, | $Fe_2O_3$ | 0.08 wt % |
| $Cr_2O_3$ | 0.08 wt %, | PbO | 57.7 wt % |
| CoO | 0.02 wt %, | CaO | 1.00 wt % |
| MgO | 0.03 wt %, | $Na_2O$ | 0.01 wt % |
| $B_2O_3$ | 6.40 wt %, | ZnO | 19.0 wt % |
| $SnO_2$ | 0.01 wt %, | $V_2O_3$ | 0.30 wt % |
| $Bi_2O_3$ | 1.50 wt %. | | |

The resulting samples were tested for leaks in the same manner as in the first example. The resistances of the conductive layers of each circuit substrate were examined. The results are shown in Table 5.

(Blank Tests 3 and 4)

Using mixed powders composed as shown in the following Table 3 for the insulation layer mixture, and using mixed powders composed as shown in the following Table 4 for the conductive layer mixture, the sintering conditions were set as shown in Table 5, and circuit substrates of a multilayer wiring structure were prepared using the same method as for Example 28. In addition, concave AlN sintered bodies with the same components as each of the insulating layer were produced in the same manner as in the first example. The two resulting concave AlN sintered bodies were piled and sealed, using the same glass.

The resulting samples were tested for leaks in the same manner as in the first example. The resistances of the conductive layers of each circuit substrate were examined. The results are shown in Table 5.

TABLE 3

| Example No. | Particle Size of AlN (μm) | Element of IIa or IIIa Group (wt %) | | B or B Compound (wt %) | | Mn or Mn Compound (wt %) | | Colorant (wt %) | | Otherak Additives (wt %) | |
|---|---|---|---|---|---|---|---|---|---|---|---|
| 28 | 0.6 | $Y_2O_3$ | 3.0 | $B_2O_3$ | 0.5 | $MnO_2$ | 0.5 | $WO_3$ | 0.5 | — | |
| 29 | 0.2 | $Y_2O_3$ | 3.0 | $B_2O_3$ | 2.0 | $MnO_2$ | 0.3 | $WO_3$ | 0.5 | — | |
| 30 | 0.6 | $Yb_2O_3$ | 3.0 | $B_2O_3$ | 0.08 | $MnO_2$ | 1.0 | $WO_3$ | 0.5 | $Al_2O_3$ | 0.5 |
| 31 | 1.0 | $Y_2O_3$ $Yb_2O_3$ | 3.0 1.0 | $B_2O_3$ | 0.5 | MnO | 0.5 | W | | $Al_2O_3$ 0.3 | 1.0 |
| 32 | 0.4 | $Y_2O_3$ | 5.0 | $H_3BO_3$ | 1.0 | Mn | 0.5 | TiN | 0.5 | — | |
| 33 | 0.4 | $Y_2O_3$ | 1.0 | B | 0.5 | $MnO_2$ | 0.2 | TaN | 0.7 | — | |
| 34 | 0.4 | $Y_2O_3$ $Dy_2O_3$ | 1.0 1.0 | $B_2O_3$ | 1.0 | $MnO_2$ | 0.5 | NbN | 0.7 | — | |
| 35 | 0.2 | $CaCO_3$ | 1.0 | $B_2O_3$ | 2.0 | $MnO_2$ | 3.0 | $WO_3$ | 0.5 | — | |
| 36 | 0.6 | CaO | 1.2 | $B_2O_3$ | 0.08 | $MnO_2$ | 1.0 | $WO_3$ | 0.5 | $Al_2O_3$ | 1.5 |
| 37 | 1.0 | $CaC_2$ | 0.8 | $B_2O_3$ | 0.5 | MnO | 0.5 | W | | $Al_2O_3$ 0.3 | 1.0 |
| 38 | 0.4 | $CaCO_3$ $CaC_2$ | 0.5 0.5 | $H_3BO_3$ | 1.0 | Mn | 0.2 | TiN | 0.5 | — | |
| 39 | 0.4 | $CaCO_3$ $BaCO_3$ | 0.8 0.5 | B | 0.5 | $MnO_2$ | 0.5 | TaN | 0.7 | — | |
| 40 | 0.4 | $CaCO_3$ | 1.0 | $B_2O_3$ | 1.0 | $MnO_2$ | 0.5 | NbN | 0.7 | — | |
| 41 | 0.6 | $Y_2O_3$ | 3.0 | WB | 2.8 | $MnO_2$ | 0.5 | $WO_3$ | 0.3 | — | |
| 42 | 0.6 | $CaCO_3$ | 1.0 | $TiB_2$ | 0.5 | $MnO_2$ | 1.0 | $WO_3$ | 0.3 | $Al_2O_3$ | 0.5 |
| 43 | 0.5 | $Y_2O_3$ | 3.0 | $LaB_6$ | 0.4 | MnO | 0.5 | $WO_3$ | 0.3 | — | |
| 44 | 0.5 | $Y_2O_3$ | 3.0 | $CaB_6$ | 0.2 | Mn | 0.2 | $WO_3$ | 0.3 | $Al_2O_3$ | 1.0 |
| Blank Test | | | | | | | | | | | |
| 3 | 0.6 | $Y_2O_3$ | 3.0 | — | | $MnO_2$ | 0.5 | $WO_3$ | 0.5 | — | |
| 4 | 0.6 | $Y_2O_3$ | 3.0 | $B_2O_3$ | 0.5 | — | | $WO_3$ | 0.5 | — | |

TABLE 4

| | Mixture for Electrically Conductive Layer | | | |
|---|---|---|---|---|
| | Electrically | | Additive | |
| Example No. | Conductive Material Particle Size (μm) | Mixing Ratio (vol %) | Composition (wt %) | AlN: Particle Diameter (μm) |
| 28 | W 0.4 | 15 | AlN 96, $Y_2O_3$ 3, $MnO_2$ 0.5 $B_2O_3$ 0.5 | 0.6 |
| 29 | W 0.4, Mo 1.0 | 35 | AlN 97, $Y_2O_3$ 3 | 0.2 |
| 30 | W 0.6 | 10 | AlN 97, $Yb_2O_3$ 3 | 0.6 |
| 31 | W 0.8 | 20 | AlN 96, $Y_2O_3$ 3, $Yb_2O_3$ 1 | 1.0 |
| 32 | Mo 2.0 | 5 | AlN 95, $Y_2O_3$ 5 | 0.4 |
| 33 | W 0.4 | 10 | AlN 98.6, $Y_2O_3$ 1 $B_2O_3$ 0.2, $MnO_2$ 0.2 | 0.4 |
| 34 | W 0.4 | 15 | AlN 98, $Y_2O_3$ 1, $Dy_2O_3$ 1 | 0.4 |
| 35 | W 0.4, Mo 1.0 | 35 | AlN 99, $CaCO_3$ 1 | 0.2 |
| 36 | W 0.6 | 10 | AlN 99, CaO 1 | 0.6 |
| 37 | W 0.8 | 20 | AlN 99.5, $CaC_2$ 0.5 | 1.0 |
| 38 | Mo 2.0 | 15 | AlN 99, $CaCO_3$ 0.5, $CaC_2$ 0.5 | 0.4 |
| 39 | W 0.4 | 10 | AlN 98.6, $CaCO_3$ 0.8 $BaCO_3$ 0.2, $B_2O_3$ 0.2, $MnO_2$ 0.2 | 0.4 |
| 40 | W 0.4 | 15 | AlN 99, $CaCO_3$ 1 | 0.4 |
| 41 | W 0.6 | 10 | AlN 97, $Y_2O_3$ 3.0 | 0.6 |
| 42 | W 0.4 | 15 | AlN 97, $CaCO_3$ 1.0 $TiB_2$ 0.5, $MnO_2$ 1, $Al_2O_3$ 0.5 | 0.6 |
| 43 | Mo 0.9 | 25 | AlN 97, $Y_2O_3$ 3.0 | 0.5 |
| 44 | Mo 1.0 | 15 | AlN 97.6, $CaCO_3$ 1.0 $CaB_6$ 0.2, $MnO_2$ 0.2, $Al_2O_3$ 1.0 | 0.5 |

TABLE 4-continued

| | | Mixture for Electrically Conductive Layer | | | |
|---|---|---|---|---|---|
| | Electrically | | Additive | | |
| Example No. | Conductive Material Particle Size (μm) | Mixing Ratio (vol %) | Composition (wt %) | | AlN: Particle Diameter (μm) |
| Blank Test | | | | | |
| 3 | W 0.4 | 15 | AlN 96.5, $Y_2O_3$ 3.0, $MnO_2$ 0.5 | | 0.6 |
| 4 | W 0.4 | 15 | AlN 96.5, $Y_2O_3$ 3.0, $MnO_2$ 0.5 | | 0.6 |

TABLE 5

| | Sintering | | | Sintered Product | |
|---|---|---|---|---|---|
| Example No. | Temp. (°C.) | Time (hr) | State of Surface | Helium Leak (atm · cc/s) | Resistivity of Electrically Conductive Layer ($\times 10^{-5}$ Ωcm) |
| 28 | 1680 | 8 | good | $<1.0 \times 10^{-10}$ | 1.1 |
| 29 | 1550 | 12 | good | $<1.0 \times 10^{-10}$ | 1.5 |
| 30 | 1680 | 12 | good | $<1.0 \times 10^{-10}$ | 1.2 |
| 31 | 1750 | 6 | good | $<1.0 \times 10^{-10}$ | 1.4 |
| 32 | 1650 | 6 | good | $<1.0 \times 10^{-10}$ | 1.0 |
| 33 | 1600 | 12 | good | $<1.0 \times 10^{-10}$ | 1.3 |
| 34 | 1630 | 12 | good | $<1.0 \times 10^{-10}$ | 1.4 |
| 35 | 1550 | 12 | good | $<1.0 \times 10^{-10}$ | 1.6 |
| 36 | 1680 | 12 | good | $<1.0 \times 10^{-10}$ | 1.3 |
| 37 | 1750 | 6 | good | $<1.0 \times 10^{-10}$ | 1.5 |
| 38 | 1650 | 6 | good | $<1.0 \times 10^{-10}$ | 1.1 |
| 39 | 1600 | 12 | good | $<1.0 \times 10^{-10}$ | 1.3 |
| 40 | 1630 | 12 | good | $<1.0 \times 10^{-10}$ | 1.4 |
| 41 | 1650 | 6 | good | $<1.0 \times 10^{-10}$ | 1.2 |
| 42 | 1650 | 8 | good | $<1.0 \times 10^{-10}$ | 1.4 |
| 43 | 1650 | 6 | good | $<1.0 \times 10^{-10}$ | 1.4 |
| 44 | 1650 | 12 | good | $<1.0 \times 10^{-10}$ | 1.3 |
| Blank Test | | | | | |
| 3 | 1680 | 8 | good | $1.0 \times 10^{-10}$ | 1.6 |
| 4 | 1680 | 8 | good | $1.0 \times 10^{-10}$ | 1.5 |

As clearly shown in Table 5, the circuit substrtes of Examples 29 to 44 exhibit good surface conditions and superior glass sealing characteristics when te glass component is used as a glass sealing material.

(Example 45)

n-butanol was added to a mixture of 94.5% by weight of AlN powder (containing 0.98% by weight oxygen impurities) of an average primary particle diameter of 0.6 μm, 3.0% by weight of $Y_2O_3$ (purity: 99.9% by weight) of an average particle diameter of 0.1 μm, 1.0% by weight of $CaCO_3$ (purity: 99.9% by weight) of an average particle diameter of 0.2 μm, 0.5% by weight) of an average particle diameter of 0.2 μm, 0.5% by weight of $Al_2O_3$ (purity: 99.9% by weight) of an average particle diameter of 0.5 μm, 0.5% by weight of $B_2O_3$ of an average particle diameter of 3 μm, and 0.5% by weight of $WO_3$ as a colorant. Then, after breaking up and mixing in a wet ball mill, the n-butanol was removed, resulting in a raw material powder, Next, 5% by weight of an acrylic binder was added to the raw material which was then granulated, after which the granulated powder was formed under a uniaxial pressure of 50 MPa to provide a concave pressed powder body. This pressed powder was heated to 700° C. in air to remove the acrylic binder. The binder-less body was set in a sintering setter formed from an AlN sintered material which was placed in a graphite furnace in an atmosphere of nitrogen gas under a pressure of one atm. and sintered for sic hours at 1,550° C. to produce an AlN sintered body.

The resulting AlN sintered body was black and exhibited no color irregularities or baking blemishes, and, in addition, had a clean surface. The sensity of the AlN sintered body was measured at 3.30 g/cm³, using Archimedes method, and the material was suitably fine. A disk with a diameter of 10 mm and a thickness of 3 mm was cut from the AlN sintered body. The thermal conductivity was measured at a room temperature of 21±2° C., using a laser flsh method conforming to JIS-R1611, and the result of measurement was 160 W/mK.

In addition, two concave AlN sintered bodies were produced in accordance with the above-mentioned method. The two resulting concave AlN sintered bodies were piled so that the open surfaces were in contact, after which they were sealed in glass, under a nitrogen atmosphere, using glass of the same composition as used in the first example. The sealed sample was allowed to stand for 40 min in a chamber filled with helium gas at five atmospheres pressure, after which the chamber was evacuated to a pressure in the order of $10^{-3}$ torr, then air at atmospheric pressure was reintroduced into the chamber. This helium cleaning process was repeated three times, and the sample was removed from the chamber and allowed to stand in air for 30 min. After this treatment, a helium leak test (fine leak detection) was performed. The amount of leaking helium was detected by a mass spectrometer. A good value of $1.0 \times 10^{-10}$ atm·cc·s$^{-1}$ or less was obtained as a result. Also, the sample was inserted into a liquid (Florinat No. 40 manufactured by Minesota Mining and Manufacturing Co.) and warmed to 120° C. for three minutes to test for gross leaks. As a result, no bubbles were created and it was confirmed that no gross leaks were present.

(Comparative example 2)

n-butanol was added to a mixture of 95.5% by weight of the AlN powder of Example 45, 3.0% by weight of $Y_2O_3$ (purity: 99.9% by weight) of an average particle diameter of 0.1 μm, 1.0% by weight of $CaCO_3$, and 0.5% by weight of $WO_3$ as a colorant, then, after breaking up and mixing in a wet ball mill, the n-butanol was removed, resulting in a raw material powder. Next, an AlN sintered body was produced from this raw material powder using the same process as for Example 45.

The density and thermal conductivity of the resulting AlN sintered body were measured in the same manner as for Example 45. The results showed a density of 3.28 g/cm$^3$, and a material of suitable fineness. The thermal conductivity was 130 W/m·K. Good surface conditions were also obtained. However, when the leak test was performed using the same method as for Example 45, a large leak of $6.0 \times 10^{-7}$ atm·cc·s$^{-1}$ was observed.

(Examples 46 to 71)

Using mixed powders composed of the AlN powders and the various additives shown in Tables 6-1 and 6-2, the sintering conditions were variously set as shown in the following Tables 7-1 and 7-2, and twenty six types of AlN sintered bodies were prepared using the same method as for Example 45. The results of the densities, thermal conductivities, surface conditions, and helium leaks for the resulting AlN sintered bodies are also shown in Tables 7-1 and 7-2. Here, as to judgement of the surface conditions, "good" in the tables indicates that there were no color irregularities or baking blemishes and no deposit were observed visually on the surface.

TABLE 6-1

| Example No. | Particle Size of AlN (μm) | Elements of IIa or IIIa Group (wt %) | | B or B Compound (wt %) | | $Al_2O_3$ (wt %) | Colorant (wt %) | | Other Additives (wt %) | |
|---|---|---|---|---|---|---|---|---|---|---|
| 45 | 0.6 | $Y_2O_3$ | 3.0, $CaCO_3$ 1.0 | $B_2O_3$ | 0.5 | 0.5 | $WO_3$ | 0.5 | — | |
| 46 | 0.1 | $Y_2O_3$ | 0.1, $CaCO_3$ 1.0 | $B_2O_3$ | 2.0 | 0.1 | $WO_3$ | 0.5 | — | |
| 47 | 0.8 | $Y_2O_3$ | 13.0, $CaCO_3$ 1.0 | $B_2O_3$ | 0.05 | 0.7 | $TiO_2$ | 0.5 | — | |
| 48 | 0.6 | $Y_2O_3$ | 5.0, $CaCO_3$ 1.0 | $B_2O_3$ | 5.0 | 0.5 | $WO_3$ | 0.5 | — | |
| 49 | 0.6 | $Dy_2O_3$ | 3.0, CaO 1.0 | $B_2O_3$ | 1.0 | 0.5 | W | 0.3 | — | |
| 50 | 0.6 | $Ho_2O_3$ | 3.0, $CaCO_3$ 1.0 | $B_2O_3$ | 2.0 | 0.5 | $TiO_2$ | 0.4 | — | |
| 51 | 0.07 | $Y_2O_3$ | 3.0, $CaCO_3$ 1.0 | $H_3BO_3$ | 1.0 | 0.1 | $WO_3$ | 0.5 | Si | 0.1 |
| 52 | 0.3 | $Y_2O_3$ $CaCO_3$ | 3.0, $Yb_2O_3$ 1.0 | $H_3BO_3$ | 1.0 | 0.3 | $WO_3$ | 0.5 | $Si_3N_4$ | 0.2 |
| 53 | 2.0 | $Y_2O_3$ $Dy_2O_3$ | 0.1, $Yb_2O_3$ 1.0, $CaCO_3$ 1.0 | $H_3BO_3$ | 1.0 | 2.0 | $MoO_3$ | 0.5 | $Si_3O_4$ | 0.2 |
| 54 | 0.6 | $Y_2O_3$ | 4.0, $CaC_2$ 1.0 | B | 0.5 | 0.5 | TaN | 0.5 | $MnO_2$ | 0.5 |
| 55 | 0.6 | $Y_2O_3$ | 2.0, CaO 1.0 | B | 0.2 | 0.5 | NbN | 0.5 | MnO | 0.5 |
| 56 | 0.6 | $Y_2O_3$ | 5.0, CaO 2.0 | B | 0.1 | 0.5 | $TiO_2$ | 0.5 | Mn | 0.2 |
| 57 | 0.1 | $CaCO_3$ | 1.0 | $B_2O_3$ | 0.2 | 0.1 | $WO_3$ | 0.5 | — | |

TABLE 6-2

| Example No. | Particle Size of AlN (μm) | Elements of IIa or IIIa Group (wt %) | | B or B Compound (wt %) | | $Al_2O_3$ (wt %) | Colorant (wt %) | | Other Additives (wt %) | |
|---|---|---|---|---|---|---|---|---|---|---|
| 58 | 0.8 | CaO | 0.5 | $B_2O_3$ | 0.05 | 0.3 | $TiO_2$ | 0.5 | — | |
| 59 | 0.6 | BaO | 1.0 | $B_2O_3$ | 0.5 | 0.5 | $WO_3$ | 0.5 | — | |
| 60 | 0.6 | MgO | 1.0 | $B_2O_3$ | 1.0 | 0.5 | W | 0.3 | — | |
| 61 | 0.6 | $CaC_2$ | 1.0 | $B_2O_3$ | 2.0 | 0.5 | TiN | 0.4 | — | |
| 62 | 0.07 | CaO | 1.0 | $H_3BO_3$ | 1.0 | 0.1 | $WO_3$ | 0.5 | — | |
| 63 | 0.3 | $CaCO_3$ | 0.5, $CaC_2$ 0.5 | $H_3BO_3$ | 1.0 | 0.3 | $WO_3$ | 0.5 | — | |
| 64 | 2.0 | $CaCO_3$ CaO | 0.5, $CaC_2$ 0.3 0.1, $BaCO_3$ 0.1 | $H_3BO_3$ | 1.5 | 1.5 | $MoO_3$ | 0.5 | — | |
| 65 | 0.6 | $CaCO_3$ | 0.5 | B | 0.6 | 0.6 | TaN | 0.5 | Si | 0.1 |
| 66 | 0.6 | $CaCO_3$ | 1.0 | B | 0.2 | 0.7 | NbN | 0.5 | $SiO_2$ | 0.2 |
| 67 | 0.6 | $CaCO_3$ | 2.0 | B | 1.2 | 1.0 | $TiO_2$ | 0.5 | $Si_3N_4$ | 0.2 |
| 68 | 0.6 | $Y_2O_3$ | 3.0, $CaCO_3$ 1.0 | WB | 2.8 | 0.5 | $WO_3$ | 0.3 | — | |
| 69 | 0.6 | $Y_2O_3$ | 3.0, $CaCO_3$ 1.0 | $TiB_2$ | 0.5 | 0.5 | $WO_3$ | 0.3 | — | |
| 70 | 0.5 | $Y_2O_3$ | 3.0, $CaCO_3$ 1.0 | $LaB_6$ | 0.4 | 0.3 | $WO_3$ | 0.3 | — | |
| 71 | 0.5 | $Y_2O_3$ | 3.0, $CaCO_3$ 1.0 | $CaB_6$ | 0.2 | 0.3 | $WO_3$ | 0.3 | — | |

TABLE 7-1

| Example No. | Sintering Temp. (°C.) | Time (hr) | Density (g/cm$^3$) | Thermal Conductivity(W/m · K) | Surface Condition | Helium Leak (atm · cc/s) |
| --- | --- | --- | --- | --- | --- | --- |
| 45 | 1550 | 6 | 3.30 | 160 | good | $<1.0 \times 10^{-10}$ |
| 46 | 1500 | 12 | 3.27 | 125 | good | $<1.0 \times 10^{-10}$ |
| 47 | 1550 | 12 | 3.39 | 135 | good | $<1.0 \times 10^{-10}$ |
| 48 | 1600 | 6 | 3.31 | 150 | good | $<1.0 \times 10^{-10}$ |
| 49 | 1620 | 6 | 3.30 | 145 | good | $<1.0 \times 10^{-10}$ |
| 50 | 1630 | 6 | 3.30 | 150 | good | $<1.0 \times 10^{-10}$ |
| 51 | 1400 | 24 | 3.30 | 130 | good | $<1.0 \times 10^{-10}$ |
| 52 | 1550 | 12 | 3.29 | 140 | good | $<1.0 \times 10^{-10}$ |
| 53 | 1680 | 6 | 3.30 | 160 | good | $<1.0 \times 10^{-10}$ |
| 54 | 1600 | 6 | 3.32 | 145 | good | $<1.0 \times 10^{-10}$ |
| 55 | 1550 | 12 | 3.29 | 135 | good | $<1.0 \times 10^{-10}$ |
| 56 | 1600 | 6 | 3.33 | 150 | good | $<1.0 \times 10^{-10}$ |
| 57 | 1600 | 12 | 3.26 | 125 | good | $<1.0 \times 10^{-10}$ |

TABLE 7-2

| Example No. | Sintering Temp. (°C.) | Time (hr) | Density (g/cm$^3$) | Thermal Conductivity(W/m · K) | Surface Condition | Helium Leak (atm · cc/s) |
| --- | --- | --- | --- | --- | --- | --- |
| 58 | 1650 | 6 | 3.26 | 135 | good | $<1.0 \times 10^{-10}$ |
| 59 | 1700 | 12 | 3.26 | 140 | good | $<1.0 \times 10^{-10}$ |
| 60 | 1700 | 12 | 3.25 | 140 | good | $<1.0 \times 10^{-10}$ |
| 61 | 1650 | 6 | 3.26 | 150 | good | $<1.0 \times 10^{-10}$ |
| 62 | 1450 | 30 | 3.26 | 120 | good | $<1.0 \times 10^{-10}$ |
| 63 | 1600 | 12 | 3.26 | 125 | good | $<1.0 \times 10^{-10}$ |
| 64 | 1700 | 24 | 3.25 | 150 | good | $<1.0 \times 10^{-10}$ |
| 65 | 1620 | 12 | 3.26 | 135 | good | $<1.0 \times 10^{-10}$ |
| 66 | 1600 | 12 | 3.26 | 130 | good | $<1.0 \times 10^{-10}$ |
| 67 | 1650 | 6 | 3.26 | 135 | good | $<1.0 \times 10^{-10}$ |
| 68 | 1550 | 6 | 3.38 | 140 | good | $<1.0 \times 10^{-10}$ |
| 69 | 1500 | 6 | 3.33 | 145 | good | $<1.0 \times 10^{-10}$ |
| 70 | 1550 | 6 | 3.33 | 148 | good | $<1.0 \times 10^{-10}$ |
| 71 | 1500 | 6 | 3.29 | 146 | good | $<1.0 \times 10^{-10}$ |

As clearly shown in Tables 7-1 and 7-2, the AlN sintered bodies of Examples 46 to 71 exhibit high density and high heat conductance, as well as good surface conditions and superior glass sealing characteristics.

(Example 72)

Into n-butanol mixed were 94.5% by weight of an AlN powder (containing 0.98% by weight of oxygen impurities) of an average primary particle diameter of 0.6 μm, 3.0% by weight of $Y_2O_3$ (purity: 99.9% by weight) of an average particle diameter of 0.1 μm, 1.0% by weight of $CaCO_3$ of an average particle diameter of 0.3 μm, 0.5% by weight of $B_2O_3$ of an average particle diameter of 3 μm, 0.5% by weight of $Al_2O_3$ of an average particle diameter of 0.4 μm, and 0.5% by weight of $WO_3$ as a colorant, by a wet method using a ball mill. This mixed powder and an organic binder were dispersed in an organic solvent to prepare a slurry. The resulting slurry was formed into sheets according to the doctor blade method and a plurality of green sheets were formed. Next, a plurality of via holes for joining the layers was formed in specified positions in these green sheets.

A conductive paste was prepared by dispersing 85% by volume of a W powder of an average particle diameter of 0.4 μm and 154 by volume of a mixed powder made up of 95% by weight of an AlN powder of an average particle diameter of 0.6 μm, 3.0% by weight of $Y_2O_3$, 1% by weight of $CaCO_3$, 0.5% by weight of $B_2O_3$ and 0.5% by weight of $Al_2O_3$, with an organic binder, into an organic solvent.

Next, the conductive paste was filled into the via holes in the green sheets by screen printing the surface to form layers of the conductive paste. Then, the green sheets formed from the conductive paste were laminated so that the positions of the via holes conformed, and hot pressing was implemented. Next, the resulting laminated body was heated to 700° C. in a nitrogen atmosphere to eliminate the organic binder. The binder-free body wassintered for 8 hr at 1,550° C. in a non-oxidizing environment of $N_2$ or the like. As a result, a ceramic circuit substrate was produced, exhibiting a multi-layer wiring structure wherein electricity passed between the conductive layers through the via holes.

The insulating layer of this ceramic circuit substrate was sufficiently dense that pores could not be seen.

The circuit substrate had a smooth surface with no warping, undulation, cracks, or swelling. When the shape of the circuit substrate was observed by an SEM, the insulating layer with AlN as the main component and the conductive layer with W as the main component were judged to be sufficiently fine.

The two concave AlN sintered bodies with the same components as the insulating layer were produced in the same manner as Example 45. After the two resulting concave AlN sintered bodies were piled so that the open surfaces were in contact, samples were fabricated by sealing these sintered bodies in glass in a nitrogen atmosphere using a glass of the following composition.

| | | | |
|---|---|---|---|
| $SiO_2$ | 6.60 wt %, | $TiO_2$ | 5.30 wt % |
| $Al_2O_3$ | 1.80 wt %, | $Fe_2O_3$ | 0.08 wt % |
| $Cr_2O_3$ | 0.08 wt %, | PbO | 57.7 wt % |
| CoO | 0.02 wt %, | CaO | 1.00 wt % |
| MgO | 0.03 wt %, | $Na_2O$ | 0.01 wt % |
| $B_2O_3$ | 6.40 wt %, | ZnO | 19.0 wt % |
| $SnO_2$ | 0.01 wt %, | $V_2O_3$ | 0.30 wt % |
| $Bi_2O_3$ | 1.50 wt %. | | |

The resulting sample was tested for leaks in the same manner as in Example 45. Good values of $1.0 \times 10^{-10}$ atm·cc·s$^{-1}$ or less were obtained as a result. Also, the sample was inserted into a liquid (Florinat No. 40 manufactured by Minesota Mining and Manufacturing Co.) and warmed to 120° C. for three minutes to test for gross leaks. No bubbles were created and it was confirmed that no gross leaks were present.

(Examples 73 to 88)

Using mixed powders composed as shown in the following Table 8 for the insulation layer mixture, and using mixed powders composed as shown in the following Table 9 for the conductive layer mixture, the sintering conditions were set as shown in Table 10, and sixteen types of ceramic circuit substrates of a multilayer wiring structure were prepared using the same method as for Example 45.

The surface shape of each of the resulting ceramic circuit substrates was examined. In addition, two concave AlN sintered bodies with the same components as each of the insulating layer were produced in the same manner as in the first example. After the two resulting concave AlN sintered bodies were piled so that the open surfaces were in cbntact, samples were fabricated by sealing these sintered bodies in glass in a nitrogen atmosphere using a glass of the following composition.

| | | | |
|---|---|---|---|
| $SiO_2$ | 6.60 wt %, | $TiO_2$ | 5.30 wt % |
| $Al_2O_3$ | 1.80 wt %, | $Fe_2O_3$ | 0.08 wt % |
| $Cr_2O_3$ | 0.08 wt %, | PbO | 57.7 wt % |
| CoO | 0.02 wt %, | CaO | 1.00 wt % |
| MgO | 0.03 wt %, | $Na_2O$ | 0.01 wt % |
| $B_2O_3$ | 6.40 wt %, | ZnO | 19.0 wt % |
| $SnO_2$ | 0.01 wt %, | $V_2O_3$ | 0.30 wt % |
| $Bi_2O_3$ | 1.50 wt %. | | |

The resulting samples were tested for leaks in the same manner as in Example 45. The resistances of the conductive layers of each circuit substrate were examined. The results are shown in Table 10.

(Blank Tests 5 and 6)

Using mixed powders composed as shown in the following Table 8 for the insulation layer mixture, and using mixed powders composed as shown in the following Table 9-2 for the conductive layer mixture, the sintering conditions were set as shown in Table 10, and circuit substrates of a multilayer wiring structure were prepared using the same method as for Example 72. In addition, concave AlN sintered bodies with the same components as each of the insulating layer were produced in the same manner as in the first example. The two resulting concave AlN sintered bodies were piled and sealed, using the same glass.

The resulting samples were tested for leaks in the same manner as in the first example. The resistances of the conductive layers of each circuit substrate were examined. The results are shown in Table 10.

TABLE 8

| | Mixture for Insulation Layer | | | | | | | | |
|---|---|---|---|---|---|---|---|---|---|
| Example No. | Particle Size of AlN (μm) | Element of IIa or IIIa Group (wt %) | | B or B Compound (wt %) | | $Al_2O_3$ (wt %) | Colorant | | Otherak Additives (wt %) |
| 72 | 0.6 | $Y_2O_3$ | 3.0, $CaCO_3$ | 1.0 $B_2O_3$ | 0.5 | 0.5 | $WO_3$ | 0.5 | — |
| 73 | 0.2 | $Y_2O_3$ | 3.0, $CaCO_3$ | 1.0 $B_2O_3$ | 2.0 | 0.2 | $WO_3$ | 0.5 | — |
| 74 | 0.6 | $Yb_2O_3$ | 2.0, CaO | 1.0 $B_2O_3$ | 0.08 | 0.5 | $WO_3$ | 0.5 | — |
| 75 | 1.0 | $Y_2O_3$ $CaCO_3$ | 3.0, $Yb_2O_3$ 1.0 | 5.0 $B_2O_3$ | 0.5 | 1.0 | W | 0.3 | — |
| 76 | 0.4 | $Y_2O_3$ | 5.0, $CaCO_3$ | 0.5 $H_3BO_3$ | 1.0 | 0.5 | TiN | 0.5 $SiO_2$ | 0.2 |
| 77 | 0.4 | $Y_2O_3$ | 5.0, CaO | 1.0 B | 0.5 | 0.5 | TaN | 0.7 $Si_3N_4$ | 0.2 |
| 78 | 0.4 | $Y_2O_3$ | 3.0, $CaCO_3$ | 0.8 $B_2O_3$ | 1.0 | 0.5 | NbN | 0.7 $MnO_2$ | 0.5 |
| 79 | 0.2 | $CaCO_3$ | 1.0 | $B_2O_3$ | 2.0 | 0.1 | $WO_3$ | 0.5 | — |
| 80 | 0.6 | CaO | 1.2 | $B_2O_3$ | 0.08 | 0.6 | $WO_3$ | 0.5 | — |
| 81 | 1.0 | $CaCO_3$ | 0.8, $BaCO_3$ | 0.2 $B_2O_3$ | 0.5 | 2.0 | W | 0.3 | — |
| 82 | 0.4 | $CaC_2$ | 0.8, $MgCO_3$ | 0.2 $H_3BO_3$ | 1.0 | 0.5 | TiN | 0.5 Si | 0.2 |
| 83 | 0.4 | CaO | 1.0 | B | 0.5 | 0.4 | TaN | 0.7 $SiO_2$ | 0.2 |
| 84 | 0.4 | $CaCO_3$ | 0.8, $CaC_2$ | 0.2 $B_2O_3$ | 1.0 | 0.5 | NbN | 0.7 $Si_3N_4$ | 0.2 |
| 85 | 0.6 | $Y_2O_3$ | 3.0, $CaCO_3$ | 1.0 WB | 2.8 | 0.5 | $WO_3$ | 0.3 | — |
| 86 | 0.6 | $Y_2O_3$ | 3.0, $CaCO_3$ | 1.0 $TiB_2$ | 0.5 | 0.5 | $WO_3$ | 0.3 | — |
| 87 | 0.5 | $Y_2O_3$ | 3.0, $CaCO_3$ | 1.0 $LaB_6$ | 0.4 | 0.3 | $WO_3$ | 0.3 | — |
| 88 | 0.5 | $Y_2O_3$ | 3.0, $CaCO_3$ | 1.0 $CaB_6$ | 0.2 | 0.3 | $WO_3$ | 0.3 | — |
| Blank Test | | | | | | | | | |
| 5 | 0.4 | $Y_2O_3$ | 3.0, $CaCO_3$ | 0.8 — | | 0.5 | NbN | 0.7 $MnO_2$ | 0.5 |
| 6 | 0.4 | $Y_2O_3$ | 3.0, $CaCO_3$ | 0.8 $B_2O_3$ | 1.0 | 0.5 | NbN | 0.7 | — |

TABLE 9-1

| | Mixture for Electrically Conductive Layer | | | |
|---|---|---|---|---|
| | Electrically | Additive | | |
| Example No. | Conductive Material Particle Size (μm) | Mixing Ratio (vol %) | Composition (wt %) | AlN: Particle Diameter (μm) |
| 72 | W 0.4 | 15 | AlN 95, $Y_2O_3$ 3, $CaCO_3$ 1 $B_2O_3$ 0.5, $Al_2O_3$ 0.5 | 0.6 |
| 73 | W 0.4, Mo 1.0 | 35 | AlN 96, $Y_2O_3$ 3, $CaCO_3$ 1 | 0.2 |
| 74 | W 0.6 | 10 | AlN 97, $Yb_2O_3$ 2, CaO 1 | 0.6 |
| 75 | W 0.8 | 20 | AlN 95, $Y_2O_3$ 3, $Yb_2O_3$ 1 $CaCO_3$ 1 | 1.0 |
| 76 | Mo 2.0 | 5 | AlN 96, $Y_2O_3$ 2, $CaCO_3$ 0.5 $H_3BO_3$ 1, $Al_2O_3$ 0.5 | 0.4 |
| 77 | W 0.4 | 10 | AlN 94.8, $Y_2O_3$ 3, CaO 1 B 0.5, $Al_2O_3$ 0.5, $Si_3N_4$ 0.2 | 0.4 |
| 78 | W 0.4 | 15 | AlN 95.2, $Y_2O_3$ 3, $CaCO_3$ 0.8 $B_2O_3$ 1 | 0.4 |
| 79 | W 0.4, Mo 1.0 | 35 | AlN 99, $CaCO_3$ 1 | 0.2 |
| 80 | W 0.6 | 10 | AlN 98.8, CaO 1.2 | 0.6 |

TABLE 9-2

| | Mixture for Electrically Conductive Layer | | | |
|---|---|---|---|---|
| | Electrically | Additive | | |
| Example No. | Conductive Material Particle Size (μm) | Mixing Ratio (vol %) | Composition (wt %) | AlN: Particle Diameter (μm) |
| 81 | W 0.8 | 20 | AlN 96.5, $CaCO_3$ 0.8, $BaCO_3$ 0.2 $B_2O_3$ 0.5, $Al_2O_3$ 2.0 | 1.0 |
| 82 | Mo 2.0 | 5 | AlN 97.5, $CaCO_3$ 0.8, $MgCO_3$ 0.2 $H_3BO_3$ 1.0, $Al_2O_3$ 0.5 | 0.4 |
| 83 | W 0.4 | 10 | AlN 99, CaO 1.0 | 0.4 |
| 84 | W 0.4 | 15 | AlN 97.5, $CaCO_3$ 0.8 $CaC_2$ 0.2, $B_2O_3$ 1.0 | 0.4 |
| 85 | W 0.6 | 10 | AlN 96.5, $Y_2O_3$ 3.0, $CaCO_3$ 1.0 $Al_2O_3$ 0.5 | 0.6 |
| 86 | W 0.4 | 15 | AlN 95, $Y_2O_3$ 3.0, $CaCO_3$ 1.0 $TiB_2$ 0.5, $Al_2O_3$ 0.5 | 0.6 |
| 87 | W 0.9 | 25 | AlN 96, $Y_2O_3$ 3.0. $CaCO_3$ 1.0 | 0.5 |
| 88 | W 1.0 | 15 | AlN 95.5, $Y_2O_3$ 3.0, $CaCO_3$ 1.0 $CaB_6$ 0.2, $Al_2O_3$ 0.3 | 0.5 |
| Blank Test | | | | |
| 5 | W 0.4 | 15 | AlN 95.2, $Y_2O_3$ 3, $CaCO_3$ 0.8 $MnO_2$ 0.5 | 0.4 |
| 6 | W 0.4 | 15 | AlN 95.2. $Y_2O_3$ 3, $CaCO_3$ 0.8 $B_2O_3$ 1 | 0.4 |

TABLE 10

| | Sintering | | Sintered Product | | |
|---|---|---|---|---|---|
| Example No. | Temp. (°C.) | Time (hr) | State of Surface | Helium Leak (atm · cc/s) | Resistivity of Electrically Conductive Layer (×$10^{-5}$ Ωcm) |
| 72 | 1550 | 8 | good | <$1.0 \times 10^{-10}$ | 1.2 |
| 73 | 1500 | 10 | good | <$1.0 \times 10^{-10}$ | 1.6 |
| 74 | 1550 | 10 | good | <$1.0 \times 10^{-10}$ | 1.2 |
| 75 | 1600 | 6 | good | <$1.0 \times 10^{-10}$ | 1.5 |
| 76 | 1600 | 6 | good | <$1.0 \times 10^{-10}$ | 1.1 |
| 77 | 1550 | 10 | good | <$1.0 \times 10^{-10}$ | 1.2 |
| 78 | 1570 | 10 | good | <$1.0 \times 10^{-10}$ | 1.3 |
| 79 | 1600 | 10 | good | <$1.0 \times 10^{-10}$ | 1.5 |
| 80 | 1650 | 10 | good | <$1.0 \times 10^{-10}$ | 1.4 |
| 81 | 1700 | 6 | good | <$1.0 \times 10^{-10}$ | 1.4 |
| 82 | 1650 | 6 | good | <$1.0 \times 10^{-10}$ | 1.0 |

TABLE 10-continued

| | Sintering | | Sintered Product | | |
|---|---|---|---|---|---|
| Example No. | Temp. (°C.) | Time (hr) | State of Surface | Helium Leak (atm · cc/s) | Resistivity of Electrically Conductive Layer ($\times 10^{-5}$ Ωcm) |
| 83 | 1670 | 10 | good | $<1.0 \times 10^{-10}$ | 1.3 |
| 84 | 1630 | 12 | good | $<1.0 \times 10^{-10}$ | 1.4 |
| 85 | 1550 | 6 | good | $<1.0 \times 10^{-10}$ | 1.2 |
| 86 | 1500 | 8 | good | $<1.0 \times 10^{-10}$ | 1.3 |
| 87 | 1550 | 6 | good | $<1.0 \times 10^{-10}$ | 1.5 |
| 88 | 1500 | 12 | good | $<1.0 \times 10^{-10}$ | 1.3 |
| Blank Test | | | | | |
| 5 | 1570 | 10 | good | $1.0 \times 10^{-10}$ | 1.8 |
| 6 | 1570 | 10 | good | $1.0 \times 10^{-10}$ | 1.9 |

As clearly shown in Table 10, the circuit substrate. s of Examples 73 to 88 exhibit good surface conditions and superior glass sealing characteristics when the glass component is used as a glass sealing material, and, in addition, are seen to have a conductive layer with a low resistance.

As previously explained in detail, the present invention provides a fine AlN sintered body with a high thermal conductivity of 120 W/m·K or greater, together with superior glass sealing characteristics using glass, and also provides a method for manufacturing the fine AlN sintered body with a high thermal conductivity of 120 W/m·K or greater, as a result of low temperature sintering at 170° C. or less, together with superior glass sealing characteristics using glass, with no baking blemishes or color irregularities, or warping and undulation.

The present invention also provides a highly reliable circuit substrate with good, close adherence between an insulating layer, of which the main component is the fine aluminum nitride with a high thermal conductivity of 120 W/m·K or greater which exhibits superior glass sealing characteristics using glass, with no baking blemishes or color irregularities, or warping and undulation, and a conductive layer, of which the main component is the conductive material; and also provides a method for manufacturing the circuit substrate with such superior characteristics, using low temperature sintering.

As mentioned above, it must be understood that the invention is in no way limited to the above embodiments and that many changes may be brought about therein without departing from the scope of the invention as defined by the appended claims.

What is claimed is:

1. A circuit substrate comprising:
an insulating layer composed of a sintered aluminum nitride composition comprising aluminum nitride as a main component, said insulating layer further comprising: a first additive comprising a compound containing a first element which is selected from the group consisting of group IIa elements and group IIIa elements of the periodic table; a second additive comprising either a simple boron or a boron compound; and a third additive comprising either a simple manganese or a manganese compound, and
an electrically conductive layer comprising a conductive component as a main component, said conductive component comprising a metal or an electrically conductive compound for exhibiting electric conductivity, said electrically conductive layer further comprising: an additive aluminum nitride; said first additive; said second additive; and said third additive.

2. The circuit substrate of claim 1, wherein the conductive component is selected from the group consisting of tungsten, tungsten boride, tungsten carbide, molybdenum, molybdenum boride and molybdenum carbide.

3. The circuit substrate of claim 1, wherein said element of the first additive is selected from scandium, yttrium, lanthanide elements, beryllium, magnesium, calcium, strontium and barium.

4. The circuit substrate of claim 1, wherein said compound giving the first additive is either of an oxide, a carbide, a nitride, a boride and a borate.

5. The circuit substrate of claim 1, wherein the first additive of the electrically conductive layer includes a compound formed by an aluminum element, an oxygen element and at least one element selected from the group consisting of group IIa elements and group IIIa elements of the periodic table.

6. The circuit substrate of claim 1, wherein the first additive is contained in the insulating layer at an amount within a range of 0.01 to 18% by weight, based on the corresponding oxide of said first additive, and relative to the amount of the insulating layer.

7. The circuit substrate of claim 1, wherein said boron compound of the second additive is selected from boron oxide, boric acid, transition metal borides, rare earth borides, borate and alkaline earth borides.

8. The circuit substrate of claim 7, wherein said boron compound of the second additive includes one selected from titanium boride, tungsten boride, zirconium boride, lanthanum boride, yttrium boride and calcium boride.

9. The circuit substrate of claim 1, wherein the second additive is contained in the insulating layer at an amount within a range of 0.002 to 4% by weight, based on boron oxide, and relative to the amount of the insulating layer.

10. The circuit substrate of claim 1, wherein said manganese compound of the third additive is one selected from manganese monoxide, manganese dioxide, potassium permanganate, manganese carbide, manganese nitride, manganese boride and manganate.

11. The circuit substrate of claim 1, wherein the third additive is contained in the insulating layer at an amount within a range of 0.005 to 4% by weight, based on manganese dioxide, and relative to the amount of the insulating layer.

12. The circuit substrate of claim 1, wherein the aluminum nitride in the electrically conductive layer is contained at an amount of 0.5 to 20% by weight relative to the amount of the electrically conductive layer.

13. The circuit substrate of claim 6, wherein the first additive in the electrically conductive layer is contained at an amount within a range of 0.001 to 3% by weight, based on the corresponding oxide of said first additive, relative to the amount of the electrically conductive layer.

14. The circuit substrate of claim 9, wherein said second additive is contained in the electrically conductive layer at an amount within a range of 0.001 to 0.2% by weight, based on boron oxide and relative to the amount of the electrically conductive layer.

15. The circuit substrate of claim 11, wherein the third additive in the electrically conductive layer is contained at an amount within a range of 0.001 to 0.2% by weight, based on manganese dioxide, and relative to the amount of the electrically conductive layer.

16. A circuit substrate, comprising:
   an insulating layer composed of a sintered aluminum nitride composition containing
      a matrix phase comprising particulate aluminum nitride; and a boundary phase interposing in the matrix phase, the boundary phase comprising: a first additive comprising a compound containing a first element which is selected from the group consisting of group IIa elements and group IIIa elements of the periodic table; a second additive comprising a simple boron or a boron compound; and a third additive comprising a simple manganese or a manganese compound; and
   an electrically conductive layer comprising
      a conductive component as a main component, said conductive component comprising a metal or an electrically conductive compound for exhibiting electric conductivity,
   said electrically conductive layer further comprising
      an additive aluminum nitride, said first additive, said second additive, said third additive.

17. A semiconductor device, comprising:
   a circuit substrate having
      an insulating layer composed of a sintered aluminum nitride composition, comprising aluminum nitride as a main component, and further comprising: a first additive comprising a compound containing a first element which is selected from the group consisting of group tin elements and group IIIa elements of the periodic table; a second additive comprising a simple boron or a boron compound; and a third additive comprising a simple manganese or a manganese compound, and
      an electrically conductive layer comprising a conductive component a main component, said conductive component comprising a metal or an electrically conductive compound for exhibiting electric conductivity, said electrically conductive layer further comprising: an additive aluminum nitride; said first additive; said second additive; and said third additive;
   a semiconductor element mounted on the circuit substrate; and
   a cap being tightly bonded to the circuit substrate with a seal to cover the semiconductor element.

18. The semiconductor device of claim 17, wherein the conductive component is selected from the group consisting of tungsten, tungsten boride, tungsten carbide, tungsten silicide, molybdenum, molybdenum boride, molybdenum carbide and molybdenum silicide.

19. The semiconductor device of claim 17, wherein said first element of the first additive is at least one selected from scandium, yttrium, lanthanide elements, beryllium, magnesium, calcium, strontium and barium.

20. The semiconductor device of claim 17, wherein said compound giving the first additive is either of an oxide, a carbide, a nitride, a boride and a borate.

21. The semiconductor device of claim 17, wherein the first additive of the electrically conductive layer includes a compound formed by an aluminum element, an oxygen element and at least one element selected from the group consisting of group IIa elements and group IIIa elements of the periodic table.

22. The semiconductor device of claim 17, wherein the first additive is contained in the insulating layer at an amount within a range of 0.01 to 18% by weight, based on the corresponding oxide of said first element, and relative to the amount of the insulating layer.

23. The semiconductor device of claim 17, wherein said boron compound of the second additive is one selected from boron oxide, boric acid, transition metal borides, rare earth borides, and alkaline earth borides, and the second additive is contained in the insulating layer at an amount within a range of 0.002 to 4% by weight, based on boron oxide, and relative to the amount of the insulating layer.

24. The semiconductor device of claim 23, wherein said boron compound of the second additive includes one selected from titanium boride, tungsten boride, zirconium boride, lanthanum boride, yttrium boride and calcium boride.

25. The semiconductor device of claim 17, wherein said manganese compound of the third additive is selected from manganese monoxide, manganese dioxide, potassium permanganate, manganese carbide, manganese nitride, manganese boride and manganate, and the third additive is contained in the insulating layer at an amount within a range of 0.005 to 4% by weight, based on manganese dioxide, and relative to the amount of the insulating layer.

26. The semiconductor device of claim 17, wherein the aluminum nitride in the electrically conductive layer is contained at an amount of 0.5 to 20% by weight relative to the amount of the electrically conductive layer.

27. The semiconductor device of claim 22, wherein the first additive in the electrically conductive layer is contained at an amount within a range of 0.001 to 3% by weight, based on the corresponding oxide of said first additive, and relative to the amount of the electrically conductive layer.

28. The semiconductor device of claim 23, wherein said second additive is contained in the electrically conductive layer at an amount within a range of 0.001 to 0.2% by weight, based on boron oxide, and relative to the amount of the electrically conductive layer.

29. The semiconductor device of claim 25, wherein the third additive in the electrically conductive layer is contained at an amount within a range of 0.001 to 0.2% by weight, based on manganese dioxide, and relative to the amount of the electrically conductive layer.

30. A semiconductor device, comprising:
   a circuit substrate having an insulating layer composed of a sintered aluminum nitride composition comaining:
      a matrix phase comprising particulate aluminum nitride; and a boundary phase interposing in the matrix phase, the boundary phase comprising a first additive comprising a compound containing a first element which is selected from the group consisting of group IIa elements and group IIa elements of the periodic table, a second additive comprising either a simple boron or a boron compound, and a third additive comprising either a simple manganese or a manganese compound; and
   and electrically cnductive layer comprising
      a conductive component as a main component, said conductive component comprising metal or an electrically conductive compound for exhibiting electric conductivity, said electrically conductive layer further comprising an additive aluminum naitride, said first additive, said second additive, and said third additive;

a semiconductor element mounted on the circuit sustrate; and a cap being tightly bonded to the circiut substrate with a seal to cover the semiconductor element.

31. A circuit substrate comprising:

an insulating layer composed of a sintered aluminum nitride composition comprising aluminum nitride as a main component, said insulating layer further comprising; a first additive comprising a compound containing a first element which is selected from the group consisting of group IIa elements and group IIIa elements of the periodic table; a second additive comprising either a simple boron or a boron compound; and a third additive comprising either a simple manganese or a manganese compound, and an electrically conductive layer comprising a conductive component as a main component, said conductive component comprising a metal or an electrically conductive compound for exhibiting electric conductivity, said electrically conductive layer further comprising: an additive aluminum nitride; and said first additive.

32. A semiconductor device, comprising:

a circuit substram having an insulating layer composed of a sintered aluminum nitride composition, comprising aluminum nitride as a main component, said composition further comprising: a first additive comprising a compound containing a first element which is selected from the group consisting of group IIa elements and group IIIa elements of the periodic table; a second additive comprising a simple boron or a boron compound; and a third additive comprising a simple manganese or a manganese compound, and an electrically conductive layer comprising a conductive component as a main component, said conductive component comprising a metal or an electrically conductive compound for exhibiting electric conductivity, said electrically conductive laver further comprising: an additive aluminum nitride; and said first additive;

a semiconductor element mounted on the circuit substrate; and a cap being tightly bonded to the circuit substrate with a seal to cover the semiconductor element.

* * * * *